United States Patent
Nakagawa et al.

(10) Patent No.: US 11,496,226 B2
(45) Date of Patent: Nov. 8, 2022

(54) ACOUSTIC WAVE DEVICE, MULTIPLEXER, HIGH-FREQUENCY FRONT END CIRCUIT, AND COMMUNICATION DEVICE

(71) Applicant: Murata Manufacturing Co., Ltd., Nagaokakyo (JP)

(72) Inventors: Ryo Nakagawa, Nagaokakyo (JP); Hideki Iwamoto, Nagaokakyo (JP); Tsutomu Takai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 318 days.

(21) Appl. No.: 16/914,522

(22) Filed: Jun. 29, 2020

(65) Prior Publication Data
US 2020/0328823 A1    Oct. 15, 2020

Related U.S. Application Data

(63) Continuation of application No. PCT/JP2018/046699, filed on Dec. 19, 2018.

(30) Foreign Application Priority Data

Jan. 12, 2018    (JP) .............................. JP2018-003868

(51) Int. Cl.
*H01L 41/047* (2006.01)
*H03H 9/02* (2006.01)
(Continued)

(52) U.S. Cl.
CPC .......... *H04B 11/00* (2013.01); *H01L 41/0472* (2013.01); *H03H 9/0222* (2013.01); *H03H 9/6483* (2013.01); *H01L 41/1873* (2013.01)

(58) Field of Classification Search
CPC . H04B 11/00; H01L 41/0472; H01L 41/1873; H03H 9/6483
(Continued)

(56) References Cited

U.S. PATENT DOCUMENTS

2008/0111450 A1    5/2008  Kando
2012/0182088 A1    7/2012  Inoue et al.
(Continued)

FOREIGN PATENT DOCUMENTS

JP    2007-036344 A    2/2007
JP    2012-151697 A    8/2012
(Continued)

OTHER PUBLICATIONS

Official Communication issued in International Patent Application No. PCT/JP2018/046699, dated Jan. 22, 2019.

*Primary Examiner* — David Vu
*Assistant Examiner* — Brandon C Fox
(74) *Attorney, Agent, or Firm* — Keating & Bennett, LLP

(57) ABSTRACT

In an acoustic wave device, an antenna end resonator that is electrically closest to a first terminal is a first acoustic wave resonator. In each of the first acoustic wave resonator and a second acoustic wave resonator, a thickness of a piezoelectric layer is about $3.5\lambda$ or less when a wavelength of an acoustic wave is denoted as $\lambda$. The first acoustic wave resonator and the second acoustic wave resonator satisfy at least one of a first condition, a second condition, and a third condition. The first condition is a condition that the first acoustic wave resonator further includes a dielectric film provided between the piezoelectric layer and an interdigital transducer electrode, and the second acoustic wave resonator does not include the dielectric film.

18 Claims, 10 Drawing Sheets

(51) Int. Cl.
  *H04B 11/00*  (2006.01)
  *H03H 9/64*  (2006.01)
  *H01L 41/187*  (2006.01)
(58) Field of Classification Search
  USPC .................................... 438/48, 52; 367/135
  See application file for complete search history.

(56) References Cited

U.S. PATENT DOCUMENTS

| | | |
|---|---|---|
| 2013/0285768 A1 | 10/2013 | Watanabe et al. |
| 2017/0244383 A1 | 8/2017 | Yasuda |
| 2018/0097500 A1 | 4/2018 | Mimura |
| 2018/0097508 A1 | 4/2018 | Iwamoto et al. |
| 2020/0366270 A1* | 11/2020 | Matsuoka .......... H03H 9/02582 |

FOREIGN PATENT DOCUMENTS

| | | |
|---|---|---|
| JP | 2017-147674 A | 8/2017 |
| WO | 2010/131737 A1 | 11/2010 |
| WO | 2012/086639 A1 | 6/2012 |
| WO | 2016/208446 A1 | 12/2016 |
| WO | 2017/006742 A1 | 1/2017 |

* cited by examiner

ACOUSTIC WAVE DEVICE, MULTIPLEXER, HIGH-FREQUENCY FRONT END CIRCUIT, AND COMMUNICATION DEVICE

CROSS REFERENCE TO RELATED APPLICATIONS

This application claims the benefit of priority to Japanese Patent Application No. 2018-003868 filed on Jan. 12, 2018 and is a Continuation Application of PCT Application No. PCT/JP2018/046699 filed on Dec. 19, 2018. The entire contents of each application are hereby incorporated herein by reference.

BACKGROUND OF THE INVENTION

1. Field of the Invention

The present invention generally relates to an acoustic wave device, a multiplexer, a high-frequency front end circuit, and a communication device. The present invention specifically relates to an acoustic wave device including a plurality of acoustic wave resonators, a multiplexer including the acoustic wave device, a high-frequency front end circuit including the multiplexer, and a communication device including the high-frequency front end circuit.

2. Description of the Related Art

A surface acoustic wave device (acoustic wave resonator) having a piezoelectric film has been known (see, for example, International Publication No. 2012/086639).

The surface acoustic wave device described in International Publication No. 2012/086639 includes a support substrate, a high acoustic velocity film, a low acoustic velocity film, a piezoelectric film, and an IDT electrode. The high acoustic velocity film is a film in which an acoustic velocity of a bulk wave propagating through the high acoustic velocity film is higher than an acoustic velocity of an acoustic wave propagating through the piezoelectric film. The low acoustic velocity film is laminated on the high acoustic velocity film, and is a film in which an acoustic velocity of a bulk wave propagating through the low acoustic velocity film is lower than the acoustic velocity of the acoustic wave propagating through the piezoelectric film. The piezoelectric film has piezoelectricity and is laminated on the low acoustic velocity film. The IDT electrode is formed on the piezoelectric film. In the surface acoustic wave device described in International Publication No. 2012/086639, it is possible to increase a Q factor.

However, when a laminated structure of the high acoustic velocity film, the low acoustic velocity film, and the piezoelectric film is used as the acoustic wave resonator of the related art described in International Publication No. 2012/086639, a high-order mode is generated in a higher frequency band than the pass band. Further, when the temperature changes, a frequency at which the high-order mode is generated changes. Accordingly, for example, in a case where an acoustic wave device includes a plurality of acoustic wave resonators of the related art, a ripple due to the high-order mode may be generated, depending on the temperature, in a pass band of a high frequency side filter connected to an antenna in common with the acoustic wave device.

SUMMARY OF THE INVENTION

Preferred embodiments of the present invention provide acoustic wave devices, multiplexers, high-frequency front end circuits, and communication devices that are each able to reduce a change, due to the temperature, of a high-order mode which is generated in a higher frequency band than the pass band, while significantly reducing or preventing deterioration of characteristics of the pass band.

An acoustic wave device according to a preferred embodiment of the present invention is provided between a first terminal which is an antenna terminal and a second terminal which is different from the first terminal. The acoustic wave device includes a plurality of acoustic wave resonators. The plurality of acoustic wave resonators include a plurality of series arm resonators and a plurality of parallel arm resonators. The plurality of series arm resonators are provided on a first path electrically connecting the first terminal and the second terminal. The plurality of parallel arm resonators are provided on a plurality of second paths electrically connecting each of a plurality of nodes on the first path and the ground. An acoustic wave resonator electrically closest to the first terminal among the plurality of acoustic wave resonators is an antenna end resonator, and the antenna end resonator is a first acoustic wave resonator. At least one acoustic wave resonator other than the antenna end resonator among the plurality of acoustic wave resonators is a second acoustic wave resonator. Each of the first acoustic wave resonator and the second acoustic wave resonator includes a piezoelectric layer, an interdigital transducer (IDT) electrode, and a high acoustic velocity member. The IDT electrode is provided on the piezoelectric layer, and includes a plurality of electrode fingers. The high acoustic velocity member is located on a side opposite to the IDT electrode with the piezoelectric layer interposed between the high acoustic velocity layer and the IDT electrode. In the high acoustic velocity member, an acoustic velocity of a bulk wave propagating through is higher than an acoustic velocity of an acoustic wave propagating through the piezoelectric layer. The thickness of the piezoelectric layer is about $3.5\lambda$ or less when the wavelength of the acoustic wave determined by an electrode finger period, which is a period of the plurality of electrode fingers of the IDT electrode, is denoted as $\lambda$. The first acoustic wave resonator and the second acoustic wave resonator satisfy at least one of a first condition, a second condition, and a third condition. The first condition is a condition that the first acoustic wave resonator further includes a dielectric film, and the second acoustic wave resonator does not include the dielectric film or further includes the dielectric film that has a thickness smaller than a thickness of the dielectric film of the first acoustic wave resonator. The dielectric film is provided between the piezoelectric layer and the IDT electrode. The second condition is a condition that a mass per unit length in an electrode finger longitudinal direction of electrode fingers of the IDT electrode of the first acoustic wave resonator is smaller than a mass per unit length in the electrode finger longitudinal direction of the electrode fingers of the IDT electrode of the second acoustic wave resonator. The third condition is a condition that a cut-angle of the piezoelectric layer of the first acoustic wave resonator is larger than a cut-angle of the piezoelectric layer of the second acoustic wave resonator.

A multiplexer according to a preferred embodiment of the present invention includes a first filter and a second filter that are defined by an acoustic wave device according to a preferred embodiment of the present invention. The second filter is provided between the first terminal and a third terminal that is different from the first terminal. The pass band of the first filter is a lower frequency band than the pass band of the second filter.

A high-frequency front end circuit according to a preferred embodiment of the present invention includes a multiplexer according to a preferred embodiment of the present invention and an amplifier circuit. The amplifier circuit is electrically connected to the multiplexer.

A communication device according to a preferred embodiment of the present invention includes a high-frequency front end circuit according to a preferred embodiment of the present invention and a signal processing circuit. The signal processing circuit processes a high frequency signal received by an antenna. The high-frequency front end circuit transmits the high frequency signal between the antenna and the signal processing circuit.

According to the acoustic wave devices, the multiplexers, the high-frequency front end circuits, and the communication devices of preferred embodiments of the present invention, a change, due to temperature, of the high-order mode which is generated in the higher frequency band than the pass band is able to be significantly reduced or prevented, while also significantly reducing or preventing the deterioration of the characteristics of the pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
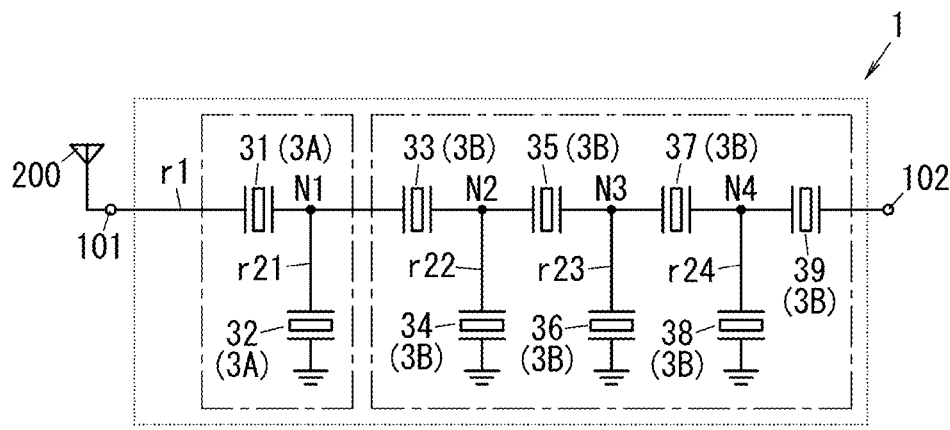
FIG. 1 is a circuit diagram of an acoustic wave device according to a Preferred Embodiment 1 of the present invention.

Hereinafter, acoustic wave devices, multiplexers, high-frequency front end circuits, and communication devices according to preferred embodiments of the present invention will be described with reference to the drawings.

FIGS. 3A, 3B, 4A, 4B, 5A, 5B, 10A, 10B, 11A, 11B, 13A, and 13B described in the following preferred embodiments or the like are schematic drawings, and the respective ratios of sizes and thicknesses of elements each in the drawings do not necessarily reflect the actual dimensional ratio.

Preferred Embodiment 1

(1) Overall Configuration of Acoustic Wave Device

First, an acoustic wave device 1 according to Preferred Embodiment 1 of the present invention will be described with reference to the drawings.

As shown in FIG. 1, the acoustic wave device 1 according to Preferred Embodiment 1 includes a plurality of (nine in the shown example) acoustic wave resonators 31 to 39. The plurality of acoustic wave resonators 31 to 39 include a plurality of (five in the shown example) series arm resonators (acoustic wave resonators 31, 33, 35, 37, and 39) and a plurality of (four in the shown example) parallel arm resonators (acoustic wave resonators 32, 34, 36, and 38).

The plurality of acoustic wave resonators 31, 33, 35, 37, and 39 are provided on a first path r1 electrically connecting a first terminal 101 (common terminal) and a second terminal 102 (input/output terminal). On the first path r1, the plurality of acoustic wave resonators 31, 33, 35, 37, and 39 are electrically connected in series. Each of the plurality of acoustic wave resonators 31, 33, 35, 37, and 39 may include a plurality of resonators electrically connected in series or in parallel. Also, in the acoustic wave device 1, an inductive or capacitive element may be provided on the first path r1 as an element other than the series arm resonator.

The plurality of acoustic wave resonators 32, 34, 36, and 38 are respectively provided on a plurality of second paths r21, r22, r23, and r24 electrically connecting a plurality of nodes N1, N2, N3, and N4 on the first path r1 and the ground. Each of the plurality of acoustic wave resonators 32, 34, 36, 38 may include a plurality of resonators electrically connected in series or in parallel. Further, in the acoustic wave device 1, an inductive or capacitive element may be provided on each of the second paths r21, r22, r23, and r24 as an element other than the parallel arm resonator.

The plurality of acoustic wave resonators 31 to 39 define a ladder band pass filter by the above-described electrical connections. That is, the acoustic wave device 1 is a ladder filter. An inductor may be electrically connected between the connection point of the acoustic wave resonators 32, 34, 36, and 38 and the ground.

The acoustic wave device 1 may have a longitudinally coupled filter structure in which a plurality of acoustic wave resonators are provided side by side in an acoustic wave propagation direction.

The acoustic wave device 1 according to Preferred Embodiment 1 is used as an acoustic wave filter with a predetermined pass band, for example. Further, the acoustic wave device 1 according to Preferred Embodiment 1 is used in a multiplexer 100 shown in FIG. 2, for example.

(2) Acoustic Wave Resonator

Next, each element of the acoustic wave device 1 according to Preferred Embodiment 1 will be described with reference to the drawings.

As described above, the acoustic wave device 1 includes the plurality of series arm resonators (acoustic wave resonators 31, 33, 35, 37, and 39) and the plurality of parallel arm resonators (acoustic wave resonators 32, 34, 36, and 38) as the plurality of acoustic wave resonators 31 to 39. Each of the plurality of acoustic wave resonators 31 to 39 is a surface acoustic wave (SAW) resonator.

The acoustic wave resonator electrically closest to the first terminal 101 among the plurality of acoustic wave resonators 31 to 39 is an antenna end resonator. In the example of FIG. 1, the acoustic wave resonator electrically closest to the first terminal 101 is the acoustic wave resonator 31. Therefore, the acoustic wave resonator 31 is the antenna end resonator.

(2.1) First Acoustic Wave Resonator

Among the plurality of acoustic wave resonators 31 to 39, the acoustic wave resonator 31 that is the antenna end resonator is a first acoustic wave resonator 3A. Further, the acoustic wave resonator 32 electrically closest to the first terminal 101 among the plurality of parallel arm resonators (acoustic wave resonators 32, 34, 36, and 38) is also the first acoustic wave resonator 3A.

Figure 3A:
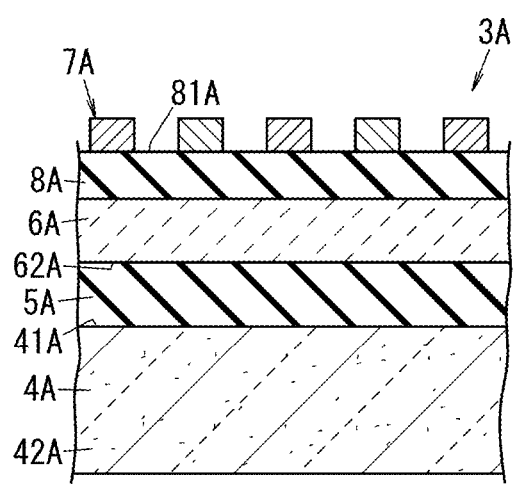
FIG. 3A is a sectional view of a first acoustic wave resonator in the acoustic wave device.

As shown in FIG. 3A, the first acoustic wave resonator 3A includes a high acoustic velocity member 4A, a low acoustic velocity film 5A, a piezoelectric layer 6A, an interdigital transducer (IDT) electrode 7A, and a dielectric film 8A.

(2.1.1) High Acoustic Velocity Member

The high acoustic velocity member 4A according to Preferred Embodiment 1 is a high acoustic velocity support substrate 42A. The high acoustic velocity support substrate 42A is located on a side opposite to the IDT electrode 7A with the piezoelectric layer 6A interposed therebetween. In the high acoustic velocity support substrate 42A, an acoustic velocity of a bulk wave propagating through the high acoustic velocity support substrate 42A is higher than an acoustic velocity of an acoustic wave propagating through the piezoelectric layer 6A. The high acoustic velocity support substrate 42A supports the low acoustic velocity film 5A, the piezoelectric layer 6A, the dielectric film 8A, and the IDT electrode 7A.

The bulk wave propagating through the high acoustic velocity support substrate 42A is the bulk wave with the lowest acoustic velocity among the plurality of bulk waves propagating through the high acoustic velocity support substrate 42A.

The high acoustic velocity support substrate 42A confines the acoustic wave in a portion where the piezoelectric layer 6A and the low acoustic velocity film 5A are laminated, and to prevent the acoustic wave from being leaked to the lower side than the high acoustic velocity support substrate 42A.

The material of the high acoustic velocity support substrate 42A is preferably silicon, for example, and the thickness of the high acoustic velocity support substrate 42A is preferably about 125 μm, for example. The material of the high acoustic velocity support substrate 42A is not limited to silicon, and may be silicon carbide, aluminum nitride, aluminum oxide, silicon carbide, silicon nitride, sapphire, lithium tantalate, lithium niobate, a piezoelectric material, for example, quartz, various ceramics, for example, alumina, zirconia, cordierite, mullite, steatite, forsterite or the like, or magnesia, diamond, or a material including any of the above materials as a main component, or a material including a mixture of any of the above materials as a main component.

(2.1.2) Low Acoustic Velocity Film

The low acoustic velocity film 5A is a film in which an acoustic velocity of a transversal bulk wave propagating through the low acoustic velocity film 5A is lower than the acoustic velocity of the bulk wave propagating through the piezoelectric layer 6A. The low acoustic velocity film 5A is provided between the high acoustic velocity support substrate 42A and the piezoelectric layer 6A. Since the low acoustic velocity film 5A is provided between the high acoustic velocity support substrate 42A and the piezoelectric layer 6A, the acoustic velocity of the acoustic wave decreases. In an acoustic wave, energy inherently concentrates on a medium with a low acoustic velocity. Therefore, a confining effect of the acoustic wave energy in the piezoelectric layer 6A and in the IDT electrode 7A in which the acoustic wave is excited is able to be significantly improved. As the result, a loss is able to be significantly reduced or prevented and a Q factor is able to be significantly increased in comparison with a case where the low acoustic velocity film 5A is not provided.

The material of the low acoustic velocity film 5A is preferably silicon oxide, for example. The material of the low acoustic velocity film 5A is not limited to silicon oxide, and may be, for example, glass, silicon oxynitride, tantalum oxide, a compound provided by adding fluorine, carbon, or boron to silicon oxide, or a material including any of the above materials as a main component.

Preferably, for example, the thickness of the low acoustic velocity film 5A is about 2.0λ or less when the wavelength of the acoustic wave determined by a period of electrode fingers of the IDT electrode 7A (first electrode fingers 73A and second electrode fingers 74A described later) is denoted as λ. By setting the thickness of the low acoustic velocity film 5A to be about 2.0λ or less, a film stress may be reduced, and as the result, a warp of a wafer is able to be significantly reduced, the yield rate is able to be significantly increased, and the characteristics are able to be stabilized. When the thickness of the low acoustic velocity film 5A is in a range of about 0.1λ or more to about 0.5λ or less, the electromechanical coupling coefficient is hardly changed.

(2.1.3) Piezoelectric Layer

The piezoelectric layer 6A is preferably made of, for example, an Γ° Y cut-X propagation LiTaO$_3$ piezoelectric single crystal. The Γ° Y cut-X propagation LiTaO$_3$ piezoelectric single crystal is a LiTaO$_3$ single crystal, when the three crystal axes of the LiTaO$_3$ piezoelectric single crystal are denoted as an X-axis, a Y-axis, and a Z-axis, provided by cutting at a plane in which an axis rotated by Γ° in a Z-axis direction from the Y-axis with the X-axis as a central axis is a normal line. The Γ° Y cut-X propagation LiTaO$_3$ piezoelectric single crystal is a single crystal in which the surface acoustic wave is propagated in an X-axis direction. A cut-angle of the piezoelectric layer 6A is represented as Γ=θ+90°, when the cut-angle is Γ [°] and Euler angles of the piezoelectric layer 6A are (φ, θ, ψ). Γ and Γ±180×n have the same meaning (crystallographically equivalent). Here, n is a natural number. The piezoelectric layer 6A is not limited to the Γ° Y cut-X propagation LiTaO$_3$ piezoelectric single crystal, and may be Γ° Y cut-X propagation LiTaO$_3$ piezoelectric ceramics, for example.

The piezoelectric layer 6A is provided directly or indirectly on the low acoustic velocity film 5A. The thickness of the piezoelectric layer 6A in a thickness direction (first direction D1) of the high acoustic velocity support substrate 42A is preferably about 3.5λ or less, for example. When the thickness of the piezoelectric layer 6A is about 3.5λ or less, the Q factor increases. Also, by setting the thickness of the piezoelectric layer 6A to be about 2.5λ or less, a TCF is able to be significantly reduced. Further, by setting the thickness of the piezoelectric layer 6A to be about 1.5λ or less, it becomes easy to adjust the acoustic velocity of the acoustic wave.

When the thickness of the piezoelectric layer 6A is about 3.5λ or less, the Q factor increases as described above, but a high-order mode is generated. In Preferred Embodiment 1, a dielectric film 8A reduces the high-order mode even when the thickness of the piezoelectric layer 6A is about 3.5λ or less. The dielectric film 8A will be described later.

In the first acoustic wave resonator 3A of the acoustic wave device 1, as a mode of the acoustic wave propagating through the piezoelectric layer 6A, there are a longitudinal wave, an SH wave, an SV wave, or a mode in which these waves are combined. In the first acoustic wave resonator 3A, the mode including the SH wave as a main component is used as the main mode. The high-order mode refers to a spurious mode that is generated on the higher frequency side than the main mode of the acoustic wave propagating through the piezoelectric layer 6A. The mode of the acoustic wave propagating through the piezoelectric layer 6A is able to be confirmed as "the main mode in which the SH wave is the main component" by a procedure as follows. The displacement distribution is analyzed by Finite Element Method and distortion is analyzed with respect to parameters of the piezoelectric layer 6A (material, Euler angles, thickness, and the like), parameters of the IDT electrode 7A (material, thickness, electrode finger period, and the like), and parameters of the low acoustic velocity film 5A (material, thickness, and the like), for example. The Euler angles of the piezoelectric layer 6A may be determined by an analysis.

The material of the piezoelectric layer 6A is not limited to LiTaO$_3$ (lithium tantalate), and may be LiNbO$_3$ (lithium niobate), for example. When the piezoelectric layer 6A is made of, for example, the Y cut-X propagation LiNbO$_3$ piezoelectric single crystal or the Y cut-X propagation LiNbO$_3$ piezoelectric ceramics, the first acoustic wave resonator 3A may use a mode in which the SH wave is a main component as a main mode with a Love wave as the acoustic wave. The single crystal material and the cut-angle of the piezoelectric layer 6A may be appropriately determined according to, for example, predetermined specifications for the filter (filter characteristics, for example, bandpass characteristics, attenuation characteristics, temperature characteristics, and a band width) or the like.

(2.1.4) IDT Electrode

Figure 4A:
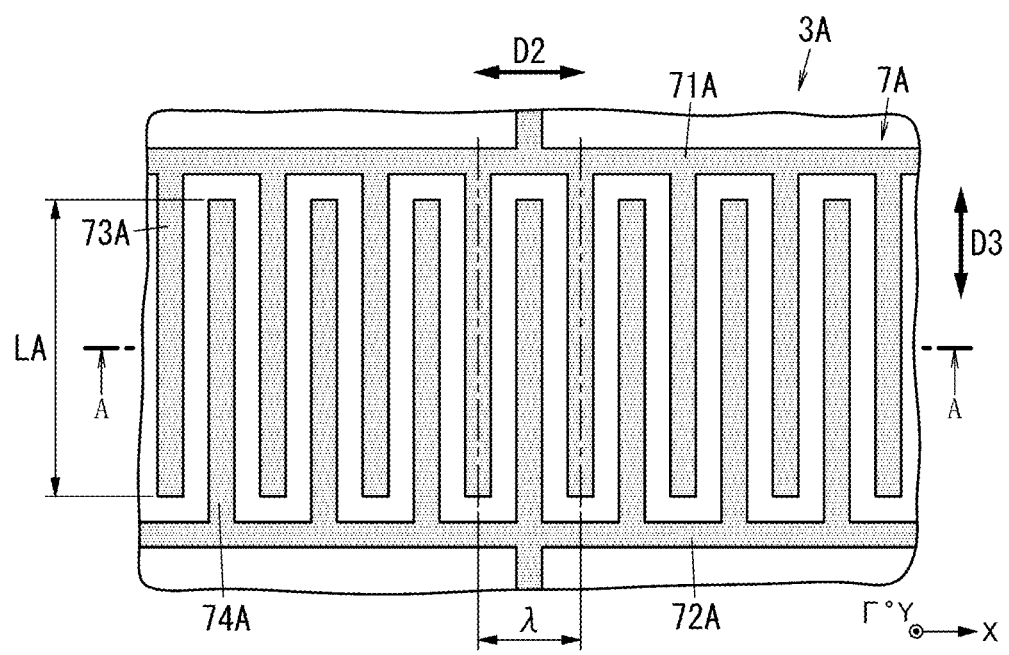
FIG. 4A is a plan view of a main portion of the first acoustic wave resonator in the acoustic wave device.
Figure 4B:
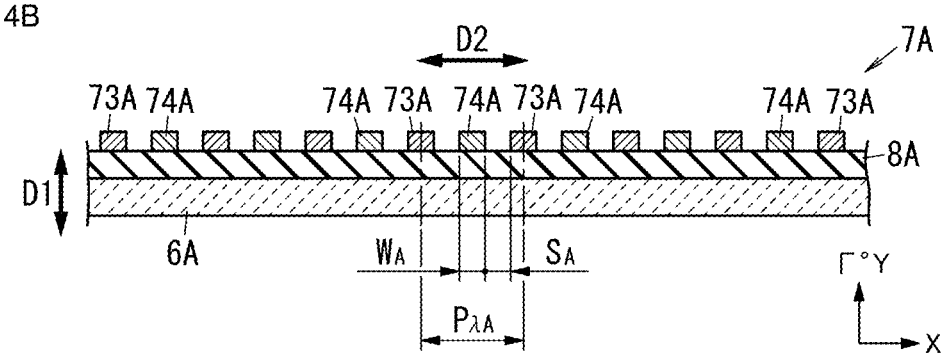
FIG. 4B shows the first acoustic wave resonator in the acoustic wave device, and is a sectional view taken along line A-A of FIG. 4A.

As shown in FIGS. 4A and 4B, the IDT electrode 7A includes a first busbar 71A, a second busbar 72A, a plurality of first electrode fingers 73A, and a plurality of second electrode fingers 74A, and is provided on a main surface 81A of the dielectric film 8A.

The first busbar 71A has an elongated shape as a second direction D2 being a longitudinal direction, and is electrically connected to the plurality of first electrode fingers 73A. The second busbar 72A is provided in an elongated shape as the second direction D2 being the longitudinal direction, and is electrically connected to the plurality of second electrode fingers 74A. The second direction D2 is a direction orthogonal or substantially orthogonal to the first direction D1.

The plurality of first electrode fingers 73A are provided side by side in the second direction D2. Each first electrode finger 73A has an elongated shape as a third direction D3 being the longitudinal direction. The plurality of first electrode fingers 73A is provided in parallel or substantially in parallel in a state of facing one another in the second direction D2. The plurality of second electrode fingers 74A are provided side by side in the second direction D2. Each second electrode finger 74A is provided in an elongated shape as the third direction D3 being the longitudinal direction. The plurality of second electrode fingers 74A are provided in parallel or substantially in parallel in a state of facing one another in the second direction D2. In Preferred Embodiment 1, each of the plurality of first electrode fingers 73A and each of the plurality of second electrode fingers 74A are alternately provided side by side. The third direction D3 is a direction orthogonal or substantially orthogonal to both the first direction D1 and the second direction D2.

When a width of each of the first electrode finger 73A and the second electrode finger 74A is denoted as W$_A$ (see FIG. 4B) and a space width between the first electrode finger 73A and the second electrode finger 74A adjacent to each other is denoted as S$_A$, a duty ratio in the IDT electrode 7A is defined by W$_A$/(W$_A$+S$_A$). The duty ratio of the IDT electrode 7A is preferably about 0.5, for example. When the wavelength of the acoustic wave determined by the electrode finger period of the IDT electrode 7A is denoted as λ, the wavelength λ is equal to the electrode finger period. The electrode finger period is defined by a repetition period P$_{λ_A}$ (see FIG. 4B) of the plurality of first electrode fingers 73A or the plurality of second electrode fingers 74A. Therefore, the repetition period P$_{λ_A}$ and λ are equal to each other. The duty ratio of the IDT electrode 7A is a ratio of the width W$_A$ of the first electrode finger 73A and the second electrode finger 74A to the value (W$_A$+S$_A$) which is a half of the electrode finger period.

The material of the IDT electrode 7A is an appropriate metal material, for example, Al, Cu, Pt, Au, Ag, Ti, Ni, Cr, Mo, W, or an alloy including any of these metals as a main component, or the like. Further, the IDT electrode 7A may have a structure in which a plurality of metal films including these metals or alloys are laminated.

(2.1.5) Dielectric Film

As shown in FIG. 3A, the dielectric film 8A is provided on the piezoelectric layer 6A. The IDT electrode 7A is provided on the dielectric film 8A. The material of the dielectric film 8A is, for example, silicon oxide.

(2.2) Second Acoustic Wave Resonator

As shown in FIG. 1, acoustic wave resonators other than the first acoustic wave resonator 3A among the plurality of acoustic wave resonators 31 to 39 are second acoustic wave resonators 3B. In the example of FIG. 1, the plurality of acoustic wave resonators 33 to 39 is the second acoustic wave resonator 3B.

Figure 3B:
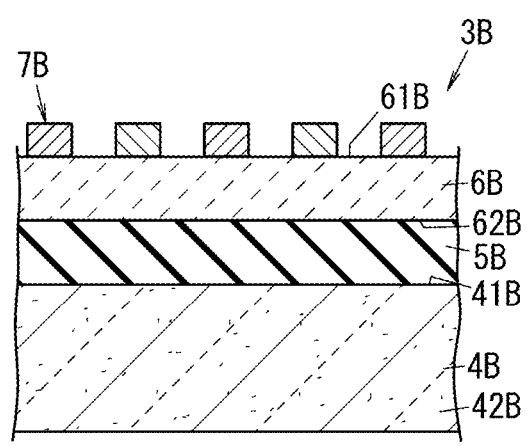
FIG. 3B is a sectional view of a second acoustic wave resonator in the acoustic wave device.

As shown in FIG. 3B, the second acoustic wave resonator 3B includes a high acoustic velocity member 4B, a low acoustic velocity film 5B, a piezoelectric layer 6B, and an IDT electrode 7B. Unlike the first acoustic wave resonator 3A (see FIG. 3A), the second acoustic wave resonator 3B does not include a dielectric film between the piezoelectric layer 6B and the IDT electrode 7B.

(2.2.1) High Acoustic Velocity Member

The high acoustic velocity member 4B of Preferred Embodiment 1 is a high acoustic velocity support substrate 42B. The high acoustic velocity support substrate 42B is located on a side opposite to the IDT electrode 7B with the piezoelectric layer 6B interposed therebetween. In the high acoustic velocity support substrate 42B, an acoustic velocity of a bulk wave propagating through the high acoustic velocity support substrate 42B is higher than an acoustic velocity of an acoustic wave propagating through the piezoelectric layer 6B. The high acoustic velocity support substrate 42B supports the low acoustic velocity film 5B, the piezoelectric layer 6B, and the IDT electrode 7B.

The high acoustic velocity support substrate 42B confines the acoustic wave in a portion where the piezoelectric layer 6B and the low acoustic velocity film 5B are laminated, and to prevent the acoustic wave from being leaked to the lower side than the high acoustic velocity support substrate 42B.

The material of the high acoustic velocity support substrate 42B is preferably silicon, for example, and the thickness of the high acoustic velocity support substrate 42B is preferably about 125 μm, for example. The material of the high acoustic velocity support substrate 42B is not limited to silicon, and may be aluminum nitride, aluminum oxide, silicon carbide, silicon nitride, sapphire, lithium tantalate, lithium niobate, or a piezoelectric material, for example, quartz, various ceramics, for example, alumina, zirconia, cordierite, mullite, steatite, forsterite or the like, or magnesia, diamond, or a material including any of the above materials as a main component, or a material including a mixture of any of the above materials as a main component.

(2.2.2) Low Acoustic Velocity Film

The low acoustic velocity film 5B is a film in which an acoustic velocity of a bulk wave propagating through the low acoustic velocity film 5B is lower than the acoustic velocity of the bulk wave propagating through the piezoelectric layer 6B. The low acoustic velocity film 5B is provided between the high acoustic velocity support substrate 42B and the piezoelectric layer 6B. Since the low acoustic velocity film 5B is provided between the high acoustic velocity support substrate 42B and the piezoelectric layer 6B, the acoustic velocity of the acoustic wave decreases. In an acoustic wave, energy inherently concentrates on a medium with a low acoustic velocity. Therefore, the confining effect of the acoustic wave energy in the piezoelectric layer 6B and in the IDT electrode 7B in which the acoustic wave is excited is able to be significantly improved. As the result, the loss is able to be significantly reduced and the Q factor is able to be significantly increased in comparison with a case where the low acoustic velocity film 5B is not provided.

The material of the low acoustic velocity film 5B is preferably silicon oxide, for example. The material of the low acoustic velocity film 5B is not limited to silicon oxide, and may be glass, silicon oxynitride, tantalum oxide, a compound provided by adding fluorine, carbon, or boron to silicon oxide, or a material including any of the above materials as a main component.

Preferably, for example, the thickness of the low acoustic velocity film 5B is about $2.0\lambda$ or less when the wavelength of the acoustic wave determined by the period of the electrode fingers of the IDT electrode 7B (first electrode fingers 73B and second electrode fingers 74B described later) is denoted as $\lambda$. By setting the thickness of the low acoustic velocity film 5B to be about $2.0\lambda$ or less, the film stress may be reduced, and as the result, a warp of the wafer is able to be significantly reduced or prevented, the yield rate is able to be significantly improved, and the characteristics are able to be stabilized. When the thickness of the low acoustic velocity film 5B is in a range of about $0.1\lambda$ or more to about $0.5\lambda$ or less, the electromechanical coupling coefficient is hardly changed.

(2.2.3) Piezoelectric Layer

Similarly to the piezoelectric layer 6A, the piezoelectric layer 6B is preferably made of, for example, the Γ° Y cut-X propagation LiTaO$_3$ piezoelectric single crystal. The cut-angle of the piezoelectric layer 6B is represented as $\Gamma=\theta+90°$, when the cut-angle is Γ [°] and the Euler angles of the piezoelectric layer 6B are (φ, θ, ψ). The piezoelectric layer 6B is not limited to the Γ° Y cut-X propagation LiTaO$_3$ piezoelectric single crystal, and may be, for example, Γ° Y cut-X propagation LiTaO$_3$ piezoelectric ceramics.

The piezoelectric layer 6B is directly or indirectly laminated on the low acoustic velocity film 5B. The thickness of the piezoelectric layer 6B in the thickness direction (first direction D1) of the high acoustic velocity support substrate 42B is preferably about $3.5\lambda$ or less, for example. When the thickness of the piezoelectric layer 6B is about $3.5\lambda$ or less, the Q factor increases. Further, by setting the thickness of the piezoelectric layer 6B to be about $2.5\lambda$ or less, the TCF is able to be significantly reduced. Further, by setting the thickness of the piezoelectric layer 6B to be about $1.5\lambda$ or less, it becomes easy to adjust the acoustic velocity of the acoustic wave.

In the second acoustic wave resonator 3B of the acoustic wave device 1, as a mode of the acoustic wave propagating through the piezoelectric layer 6B, there are a longitudinal wave, an SH wave, an SV wave, or a mode in which these waves are combined. In the second acoustic wave resonator 3B, the mode including the SH wave as a main component is used as a main mode. A high-order mode refers to a spurious mode that is generated on the higher frequency side than the main mode of the acoustic wave propagating through the piezoelectric layer 6B. The mode of the acoustic wave propagating through the piezoelectric layer 6B is able to be confirmed as "the main mode in which the SH wave is the main component" by a procedure as follows. The displacement distribution is analyzed by Finite Element Method and distortion is analyzed with respect to parameters of the piezoelectric layer 6B (material, Euler angles, thickness, and the like), parameters of the IDT electrode 7B (material, thickness, electrode finger period, and the like), and parameters of the low acoustic velocity film 5B (material, thickness, and the like), for example. The Euler angles of the piezoelectric layer 6B may be determined by an analysis.

The material of the piezoelectric layer 6B is not limited to LiTaO$_3$, and may be LiNbO$_3$, for example. When the piezoelectric layer 6B is made of, for example, the Y cut-X propagation LiNbO$_3$ piezoelectric single crystal or the Y cut-X propagation LiNbO$_3$ piezoelectric ceramics, the first acoustic wave resonator 3A and the second acoustic wave resonator 3B are able to use a mode in which the SH wave is a main component as a main mode with a Love wave as the acoustic wave. The single crystal material and the cut-angle of the piezoelectric layer 6B may be appropriately determined according to, for example, predetermined specifications for the filter (filter characteristics, for example, bandpass characteristics, attenuation characteristics, temperature characteristics, and a band width) or the like.

(2.2.4) IDT Electrode

Figure 5A:
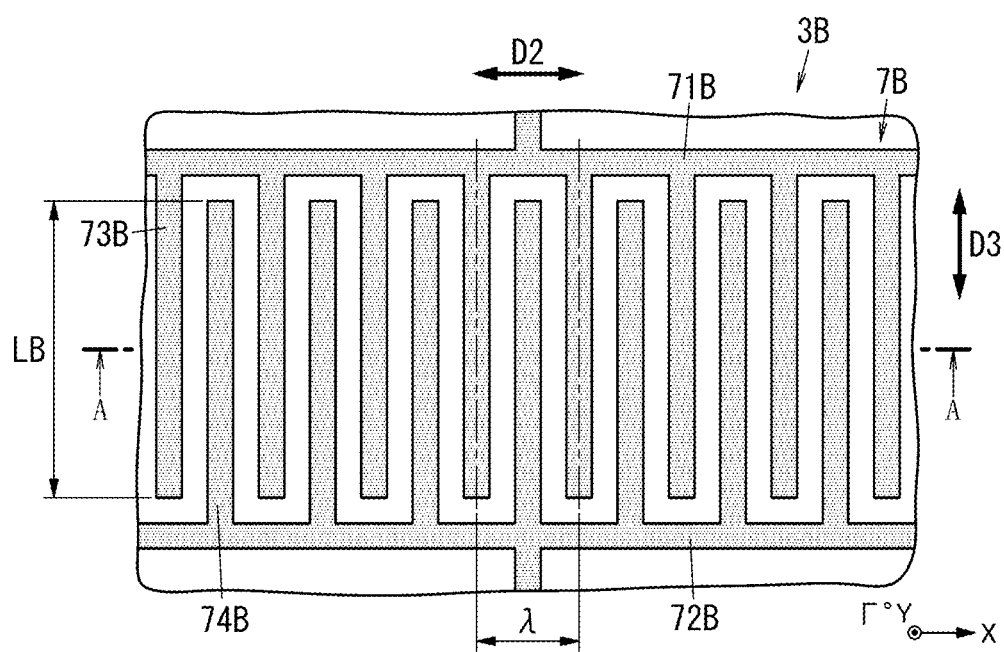
FIG. 5A is a plan view of a main portion of the second acoustic wave resonator in the acoustic wave device.
Figure 5B:
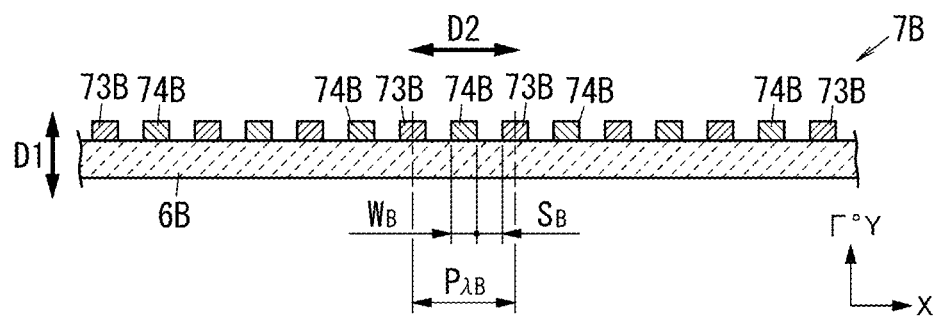
FIG. 5B shows the second acoustic wave resonator in the acoustic wave device, and is a sectional view taken along line A-A of FIG. 5A.

As shown in FIGS. 5A and 5B, similarly to the IDT electrode 7A, the IDT electrode 7B includes a first busbar 71B, a second busbar 72B, a plurality of first electrode fingers 73B, and a plurality of second electrode fingers 74B, and is provided on a main surface 61B of the piezoelectric layer 6B (see FIG. 3B).

Similarly to the first busbar 71A, the first busbar 71B has an elongated shape as the second direction D2 being the longitudinal direction, and is electrically connected to the plurality of first electrode fingers 73B. Similarly to the second busbar 72A, the second busbar 72B is provided in an elongated shape as the second direction D2 being the longitudinal direction, and is electrically connected to the plurality of second electrode fingers 74B.

The plurality of first electrode fingers 73A are provided side by side in the second direction D2. Each first electrode finger 73A is provided in an elongated shape as the third direction D3 being the longitudinal direction. The plurality of first electrode fingers 73B is provided in parallel or substantially in parallel in a state of facing one another in the second direction D2. The plurality of second electrode fingers 74B is provided side by side in the second direction D2. Each second electrode finger 74B is provided in an elongated shape as the third direction D3 being the longitudinal direction. The plurality of second electrode fingers 74B is provided in parallel or substantially in parallel in a state of facing one another in the second direction D2. In Preferred Embodiment 1, each of the plurality of first electrode fingers 73B and each of the plurality of second electrode fingers 74B are alternately provided side by side.

When a width of each of the first electrode finger 73B and the second electrode finger 74B is denoted as $W_B$ (see FIG. 5B) and a space width between the first electrode finger 73B and the second electrode finger 74B adjacent to each other is denoted as $S_B$, a duty ratio in the IDT electrode 7B is defined by $W_B/(W_B+S_B)$. The duty ratio of the IDT electrode 7B is preferably about 0.5, for example. When the wavelength of the acoustic wave determined by the electrode finger period of the IDT electrode 7B is denoted as λ, the wavelength λ is equal to the electrode finger period. The electrode finger period is defined by the repetition period $P_{\lambda_B}$ (see FIG. 5B) of the plurality of first electrode fingers 73B or the plurality of second electrode fingers 74B. Therefore, the repetition period $P_{\lambda_B}$ and λ are equal to each other. The duty ratio of the IDT electrode 7B is a ratio of the width $W_B$ of the first electrode finger 73B and the second electrode finger 74B to the value $(W_B+S_B)$ which is a half of the electrode finger period.

The material of the IDT electrode 7B is an appropriate metal material, for example, Al, Cu, Pt, Au, Ag, Ti, Ni, Cr, Mo, W, or an alloy including any of these metals as a main component, or the like. Further, the IDT electrode 7B may have a structure in which a plurality of metal films including these metals or alloys are laminated.

(3) Operation of Acoustic Wave Device

Figure 6:
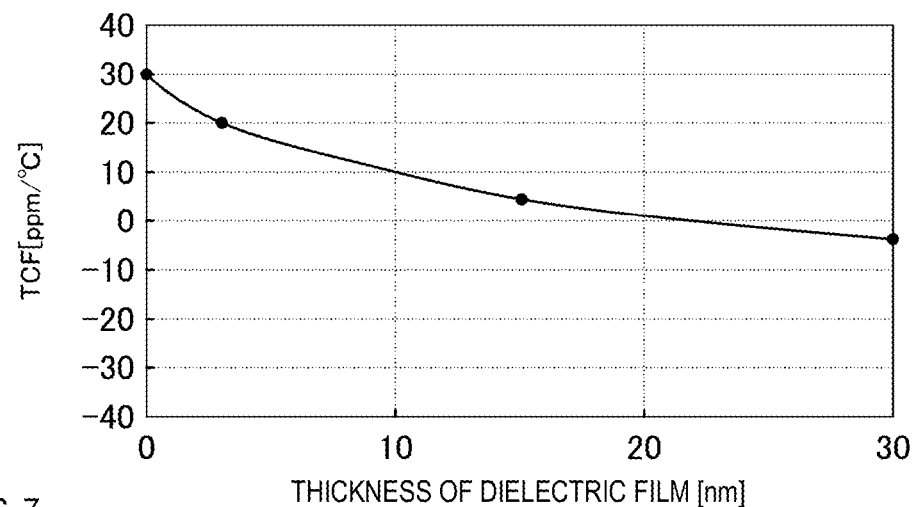
FIG. 6 is a graph describing a relationship between a thickness of a dielectric film and a temperature coefficient of frequency (TCF) with respect to the first acoustic wave resonator.
Figure 7:
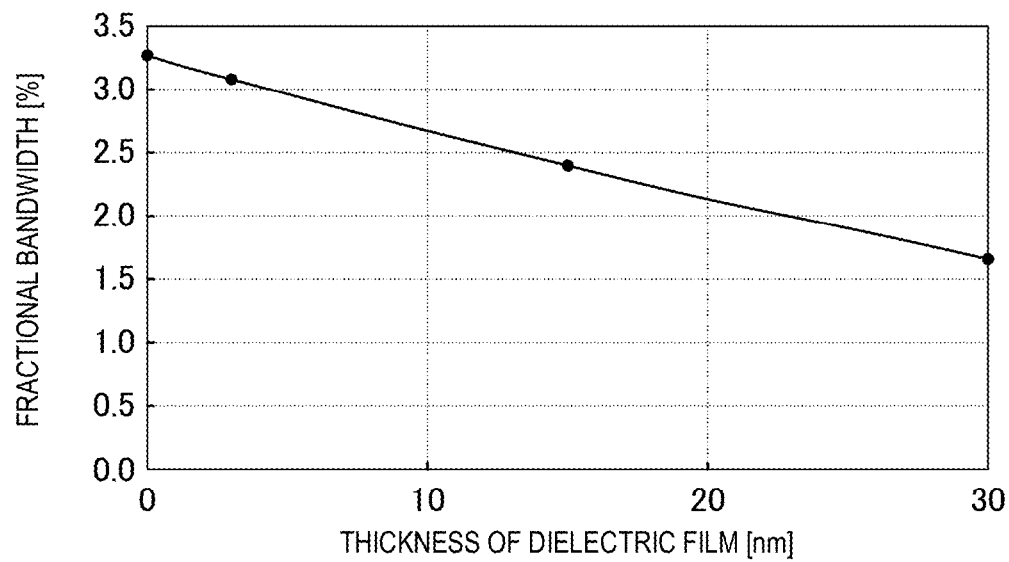
FIG. 7 is a graph describing a relationship between a thickness of the dielectric film and a fractional bandwidth with respect to the first acoustic wave resonator.

In the first acoustic wave resonator 3A, the plane 41A of the high acoustic velocity member 4A defined by a silicon substrate is denoted as (111) plane. The thicknesses of the low acoustic velocity film 5A, the piezoelectric layer 6A, and the IDT electrode 7A are standardized by the λ, which is the wavelength of the acoustic wave determined by the electrode finger period of the IDT electrode 7A. In the first acoustic wave resonator 3A, λ is preferably set to about 1.48 μm, for example. FIG. 6 shows a relationship between the thickness of the dielectric film 8A and the TCF in the first acoustic wave resonator 3A when the thickness of the IDT electrode 7A made of aluminum is about 0.07λ, the thickness of the piezoelectric layer 6A made of the 50° Y cut-X propagation LiTaO$_3$ piezoelectric single crystal is about 0.3λ, the thickness of the low acoustic velocity film 5A made of silicon oxide is about 0.35λ, and the thickness of the dielectric film 8A is changed in a range from about 0 nm to about 30 nm. FIG. 7 shows a relationship between the thickness of the dielectric film 8A and the fractional bandwidth of the first acoustic wave resonator 3A.

As shown in FIG. 6, in the first acoustic wave resonator 3A, the TCF tends to decrease as the thickness of the dielectric film 8A increases in a range in which the TCF is a positive value. The same or similar tendency to decrease the TCF applies to a case where the surface 41A of the high acoustic velocity member 4A, which is on the side of the piezoelectric layer 6A, is (110) plane or (100) plane. From the viewpoint of significantly reducing or preventing frequency fluctuation of resonance characteristics of the first acoustic wave resonator 3A due to the temperature change, the thickness of the dielectric film 8A is preferably thicker when the thickness is about 22 nm or less, for example. That is, in the first acoustic wave resonator 3A, from the viewpoint of reducing the TCF of the first acoustic wave resonator 3A, the thickness of the dielectric film 8A is preferably thicker. Further from FIG. 7, in the first acoustic wave resonator 3A, the fractional bandwidth tends to be narrow when the thickness of the dielectric film 8A is thick. The same or similar tendency to narrow the bandwidth applies to a case where the surface 41A of the high acoustic velocity member 4A, which is on the side of the piezoelectric layer 6A, is (110) plane or (100) plane. In the first acoustic wave resonator 3A, from the viewpoint of widening the fractional bandwidth of the first acoustic wave resonator 3A, the thickness of the dielectric film 8A is preferably smaller. Further preferably, the dielectric film 8A is not included.

In the acoustic wave device 1 according to Preferred Embodiment 1, the antenna end resonator is the first acoustic wave resonator 3A. The high-order mode is able to be significantly reduced or prevented since the surface 41A of the high acoustic velocity member 4A of the first acoustic wave resonator 3A, which is on the side of the piezoelectric layer 6A, is (111) plane or (110) plane. In addition, in the acoustic wave device 1, at least one of the acoustic wave resonators 33 to 39 other than the antenna end resonator among the plurality of acoustic wave resonators 31 to 39 is the second acoustic wave resonator 3B. Deterioration of the characteristics is able to be significantly reduced or prevented since the surface 41B of the high acoustic velocity member 4B of the second acoustic wave resonator 3B, which is on the side of the piezoelectric layer 6B, is (100) plane. Further, in the acoustic wave device 1, since the piezoelectric layer 6A of the first acoustic wave resonator 3A is thinner than the piezoelectric layer 6B of the second acoustic wave resonator 3B, the high-order mode is able to be significantly reduced or prevented.

Here, in the first acoustic wave resonator 3A, since the dielectric film 8A is provided between the piezoelectric layer 6A and the IDT electrode 7A, the TCF is able to be significantly reduced. More specifically, even in a case where a high-order mode is present, a degree of change due to temperature in a frequency at which the high-order mode is generated is able to be significantly reduced in comparison with a structure in which the dielectric film 8A is not provided. That is, in comparison with the structure in which the dielectric film 8A is not provided, the change of the high-order mode due to temperature is able to be significantly reduced or prevented.

(4) Multiplexer

Next, the multiplexer 100 according to Preferred Embodiment 1 will be described with reference to FIG. 2.

Figure 2:
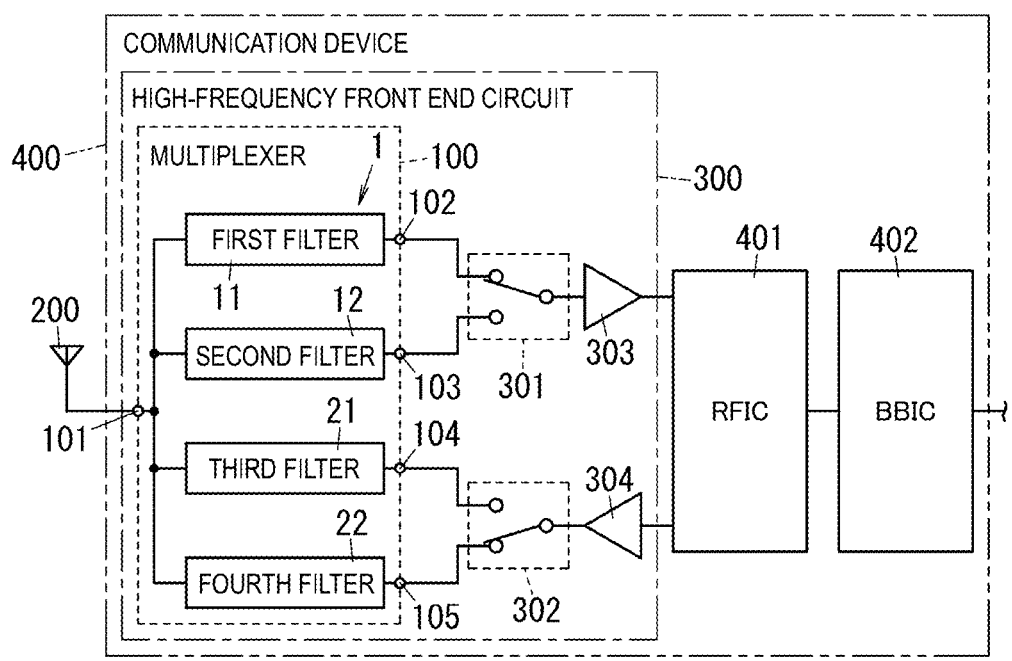
FIG. 2 is a diagram of a communication device including the acoustic wave device.

As shown in FIG. 2, the multiplexer 100 includes a first filter 11, a second filter 12, a third filter 21, and a fourth filter 22. Further, the multiplexer 100 includes the first terminal 101, the second terminal 102, a third terminal 103, a fourth terminal 104, and a fifth terminal 105.

The first terminal 101 is an antenna terminal that may be electrically connected to an antenna 200 outside of the multiplexer 100. The multiplexer 100 is electrically connected to the antenna 200 via the first terminal 101. The first to fourth filters 11, 12, 21, and 22 are electrically connected to the first terminal 101 in common.

The first filter 11 is a reception filter provided between the first terminal 101 and the second terminal 102. The first filter 11 passes a signal in the pass band of the first filter 11 and attenuates a signal outside of the pass band.

The second filter 12 is a reception filter provided between the first terminal 101 and the third terminal 103. The second filter 12 passes a signal in the pass band of the second filter 12 and attenuates a signal outside of the pass band.

The first filter 11 and the second filter 12 have different pass bands from each other. In the multiplexer 100, the pass band of the first filter 11 is a lower frequency band than the pass band of the second filter 12. Therefore, in the multiplexer 100, the highest frequency of the pass band of the first filter 11 is lower than the minimum frequency of the pass band of the second filter 12.

The third filter 21 is a transmission filter provided between the first terminal 101 and the fourth terminal 104. The third filter 21 passes a signal in the pass band of the third filter 21 and attenuates a signal outside of the pass band.

The fourth filter 22 is a transmission filter provided between the first terminal 101 and the fifth terminal 105. The fourth filter 22 passes a signal in the pass band of the fourth filter 22 and attenuates a signal outside of the pass band.

An inductor may be electrically connected in series between the first to fourth filters 11, 12, 21, and 22 and the first terminal 101. The inductor is a circuit element for impedance matching between the antenna 200 and the first to fourth filters 11, 12, 21, and 22, and is not an essential element.

In the first filter 11 which is the acoustic wave device 1, as described above, the dielectric film 8A is provided between the piezoelectric layer 6A and the IDT electrode 7A in the first acoustic wave resonator 3A (see FIG. 1) which is electrically closest to the antenna 200. Accordingly, the TCF is able to be significantly reduced. Accordingly, even in a case where the high-order mode is generated, when temperature changes, the change in the frequency is small at which the high-order mode is generated. Therefore, with the design in advance that the pass band of the second filter 12 is separated from the frequency at which the high-order mode is generated in the first filter 11, an overlap of the high-order mode and the pass band of the second filter 12 is able to be significantly reduced or prevented even when temperature changes.

(5) High-Frequency Front End Circuit

Next, a high-frequency front end circuit 300 according to Preferred Embodiment 1 will be described with reference to FIG. 2.

As shown in FIG. 2, the high-frequency front end circuit 300 includes the multiplexer 100, a first switch circuit 301, a second switch circuit 302, a first amplifier circuit 303, and a second amplifier circuit 304.

The first switch circuit 301 is provided between the first filter 11, the second filter 12, and the first amplifier circuit 303. The first switch circuit 301 includes two terminals to be selected individually connected to the second terminal 102 and the third terminal 103 of the multiplexer 100, and a common terminal electrically connected to the first amplifier circuit 303. That is, the first switch circuit 301 is electrically connected to the first filter 11 via the second terminal 102, and is electrically connected to the second filter 12 via the third terminal 103. The first switch circuit 301 switches the filters between the first filter 11 and the second filter 12, to be electrically connected to the first amplifier circuit 303.

The first switch circuit 301 is preferably a single pole double throw (SPDT) switch, for example. The first switch circuit 301 is controlled by a control circuit (not shown). The first switch circuit 301 electrically connects the common terminal and the terminal to be selected in accordance with a control signal from the control circuit. The first switch circuit 301 may include a switch integrated circuit (IC). In the first switch circuit 301, the number of terminals to be selected to be electrically connected to the common terminal is not limited to one, and may be plural. That is, the high-frequency front end circuit 300 may support the carrier aggregation (Carrier Aggregation).

The second switch circuit 302 is provided between the third filter 21, the fourth filter 22, and the second amplifier circuit 304. The second switch circuit 302 includes two terminals to be selected individually connected to the fourth terminal 104 and the fifth terminal 105 of the multiplexer 100, and a common terminal electrically connected to the second amplifier circuit 304. That is, the second switch circuit 302 is electrically connected to the third filter 21 via the fourth terminal 104, and is electrically connected to the fourth filter 22 via the fifth terminal 105. The second switch circuit 302 switches the filters between the third filter 21 and the fourth filter 22, to be electrically connected to the second amplifier circuit 304.

The second switch circuit 302 is preferably a SPDT switch, for example. The second switch circuit 302 is controlled by the control circuit. The second switch circuit 302 electrically connects the common terminal and the terminal to be selected in accordance with a control signal from the control circuit. The second switch circuit 302 may include a switch IC. In the second switch circuit 302, the number of terminals to be selected connected to the common terminal is not limited to one, and may be plural.

The first amplifier circuit 303 amplifies a high frequency signal (reception signal) via the antenna 200, the multiplexer 100, and the first switch circuit 301, and outputs the amplified high frequency signal to an outside of the high-frequency front end circuit 300 (for example, RF signal processing circuit 401 described later). The first amplifier circuit 303 is a low noise amplifier circuit.

The second amplifier circuit 304 amplifies a high frequency signal (transmission signal) outputted from the outside of the high-frequency front end circuit 300 (for example, RF signal processing circuit 401 described later), and outputs the amplified high frequency signal to the antenna 200 via the second switch circuit 302 and the multiplexer 100. The second amplifier circuit 304 is a power amplifier circuit.

(6) Communication Device

Next, a communication device 400 according to Preferred Embodiment 1 will be described with reference to FIG. 2.

As shown in FIG. 2, the communication device 400 includes the high-frequency front end circuit 300, an RF signal processing circuit 401, and a baseband signal processing circuit 402. The RF signal processing circuit 401 and the baseband signal processing circuit 402 define a signal processing circuit that processes a high frequency signal.

The RF signal processing circuit 401 is preferably a radio frequency integrated circuit (RFIC), for example, and performs signal processing on a high frequency signal including a transmission signal and a reception signal. The RF signal processing circuit 401 performs signal processing, for example, down-conversion of the high frequency signal (reception signal) outputted from the first amplifier circuit 303, and outputs a high frequency signal subjected to the signal processing to the baseband signal processing circuit 402.

The baseband signal processing circuit 402 is a baseband integrated circuit (BBIC), for example, and performs signal processing on each of a transmission signal from the outside and a high frequency signal from the RF signal processing circuit 401.

(7) Advantageous Effects

As described above, in the acoustic wave device 1 according to Preferred Embodiment 1, in the first acoustic wave resonator 3A, the dielectric film 8A is provided between the piezoelectric layer 6A and the IDT electrode 7A. Accordingly, even when a high-order mode is present, the degree of change due to temperature in the frequency at which the high-order mode is generated is able to be significantly reduced. That is, the change of the high-order mode due to temperature is able to be significantly reduced or prevented.

In the acoustic wave device 1 according to Preferred Embodiment 1, an antenna end resonator is a chip different from the acoustic wave resonators other than the antenna end resonator among the plurality of acoustic wave resonators 31 to 39. Accordingly, variations in the characteristics of the acoustic wave device other than the antenna end resonator are able to be significantly reduced or prevented.

In the acoustic wave device 1 according to Preferred Embodiment 1, in the first acoustic wave resonator 3A and the second acoustic wave resonator 3B, the low acoustic velocity films 5A and 5B are provided between the high acoustic velocity layers 4A and 4B, and the piezoelectric layers 6A and 6B. Thus, both of expansion of the fractional bandwidth and significant improvement of the frequency-temperature characteristics are able to be provided because of an increase in the electromechanical coupling coefficient.

In the acoustic wave device 1 according to Preferred Embodiment 1, the loss is able to be significantly reduced or prevented and the Q factor is able to be significantly increased in comparison with a case where the low acoustic velocity films 5A and 5B are not provided.

In the multiplexer 100 according to Preferred Embodiment 1, the acoustic wave device 1 is included for the first filter 11. Thus, an influence of the high-order mode generated in the first filter 11 on the second filter 12 is able to be significantly reduced or prevented.

(8) Modifications

Hereinafter, modifications of Preferred Embodiment 1 will be described.

Figure 8:
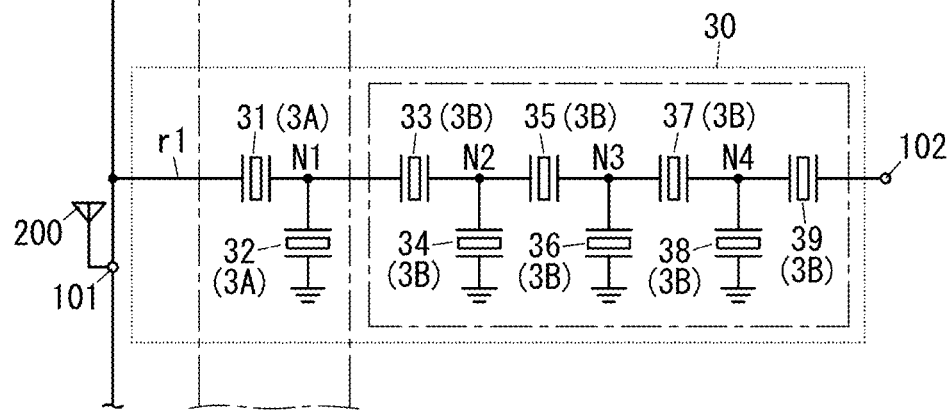
FIG. 8 is a circuit diagram of a multiplexer according to a Modification 1 of Preferred Embodiment 1 of the present invention.

As shown in FIG. 8, a multiplexer 100b according to Modification 1 of Preferred Embodiment 1 includes a plurality of resonator groups 30 (only two resonator groups are shown in FIG. 8) defined by the plurality of acoustic wave resonators 31 to 39. In the plurality of resonator groups 30, the first terminal 101 is a common terminal, and the second terminal 102 is an individual terminal. In the multiplexer 100b, the antenna end resonators (acoustic wave resonators 31) of the plurality of resonator groups 30 are integrated in one chip. Thus, in the multiplexer 100b according to Modification 1, in the circuit including the plurality of resonator groups 30, the size is able to be significantly reduced, and the variation in the characteristics of the antenna end resonator is able to be significantly reduced or prevented. In FIG. 8, the acoustic wave resonators surrounded by an alternate long and short dash line are integrated in one chip. For example, seven second acoustic wave resonators 3B in the one resonator group 30 are integrated in one chip. In addition, two first acoustic wave resonators 3A in each resonator group 30 (in the shown example, four first acoustic wave resonators 3A) are integrated in one chip. In the multiplexer 100b according to Modification 1, the acoustic wave resonators 31 and 32 of the plurality of resonator groups 30 are integrated in one chip, but it is sufficient that at least the acoustic wave resonators 31 in the plurality of resonator groups 30 are integrated in one chip.

In the multiplexer 100b according to Modification 1, the plurality of resonator groups 30 defines filters with different pass bands from each other.

In the multiplexer 100b according to Modification 1, the variation in the characteristics of the antenna end resonators of the plurality of resonator groups 30 is able to be significantly reduced or prevented, and the size of the multiplexer 100b is able to be significantly reduced.

Figure 9:
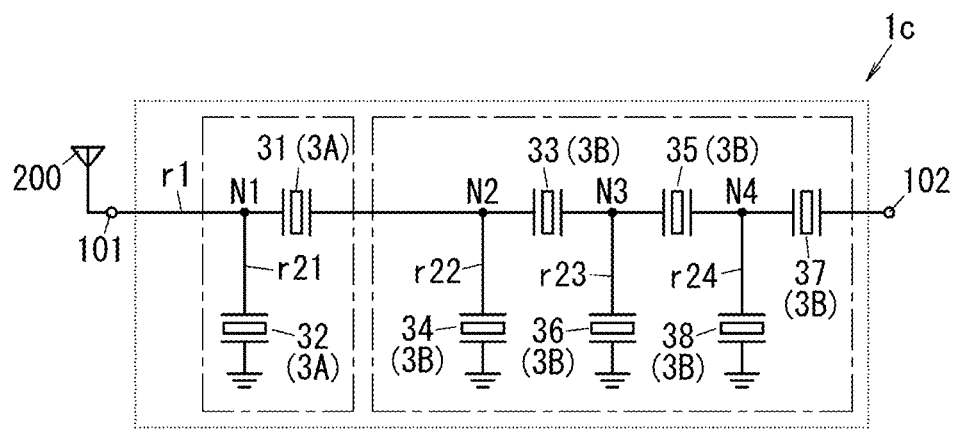
FIG. 9 is a circuit diagram of an acoustic wave device according to a Modification 2 of Preferred Embodiment 1 of the present invention.

As shown in FIG. 9, an acoustic wave device 1c according to Modification 2 of Preferred Embodiment 1 differs from the acoustic wave device 1 according to Preferred Embodiment 1 in a connection relationship of the plurality of (eight) acoustic wave resonators 31 to 38. In the acoustic wave device 1c according to Modification 2, the same or similar elements as those of the acoustic wave device 1 according to Preferred Embodiment 1 are denoted by the same reference numerals, and the description thereof will be omitted.

In the acoustic wave device 1c, in the plurality of acoustic wave resonators 31 to 38, one series arm resonator (acoustic wave resonator 31) among the plurality of (four) series arm resonators (acoustic wave resonators 31, 33, 35, and 37) and one parallel arm resonator (acoustic wave resonator 32) among the plurality of (four) parallel arm resonators (acoustic wave resonators 32, 34, 36, and 38) are directly connected to the first terminal 101. The expression "One series arm resonator (acoustic wave resonator 31) is directly connected to the first terminal 101" means that the one series arm resonator electrically connected to the first terminal 101 without other acoustic wave resonators 32 to 38 interposed therebetween. Further, the expression "One parallel arm resonator (acoustic wave resonator 32) is directly connected to the first terminal 101" means that the one parallel arm resonator electrically connected to the first terminal 101 without other acoustic wave resonators 31 and 33 to 38 interposed therebetween.

In the acoustic wave device 1c, both of the one series arm resonator (acoustic wave resonator 31) and the one parallel arm resonator (acoustic wave resonator 32) are defined by the first acoustic wave resonator 3A as the antenna end resonators, but the circuitry is not limited to the above. For example, in the acoustic wave device 1c, at least either one of the one series arm resonator (acoustic wave resonator 31) or the one parallel arm resonator (acoustic wave resonator 32) may be defined by the first acoustic wave resonator 3A as the antenna end resonator.

Figure 10A:
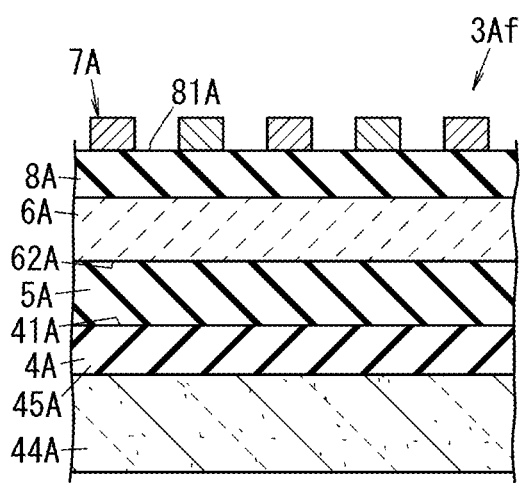
FIG. 10A is a sectional view of a first acoustic wave resonator in an acoustic wave device according to a Modification 3 of Embodiment 1 of the present invention.
Figure 10B:
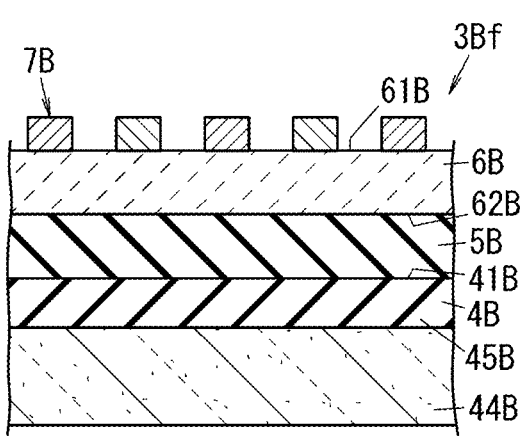
FIG. 10B is a sectional view of a second acoustic wave resonator in the acoustic wave device.

The acoustic wave device according to Modification 3 of Preferred Embodiment 1 differs from the acoustic wave device 1 according to Preferred Embodiment 1 in that the acoustic wave device according to Modification 3 of Preferred Embodiment 1 includes a first acoustic wave resonator 3Af shown in FIG. 10A and a second acoustic wave resonator 3Bf shown in FIG. 10B, instead of the first acoustic wave resonator 3A and the second acoustic wave resonator 3B of the acoustic wave device 1 according to Preferred Embodiment 1. In the acoustic wave device according to Modification 3, the same or similar elements as those of the acoustic wave device 1 according to Preferred Embodiment 1 are denoted by the same reference numerals, and the description thereof will be omitted.

The high acoustic velocity member 4A of the first acoustic wave resonator 3Af includes a high acoustic velocity film 45A and a support substrate 44A, instead of the high acoustic velocity support substrate 42A. The high acoustic velocity film 45A is provided on the support substrate 44A. Here, the expression "provided on the support substrate 44A" includes a case being directly provided on the support substrate 44A, and a case being indirectly provided on the support substrate 44A. In the high acoustic velocity film 45A, an acoustic velocity of a bulk wave propagating through the high acoustic velocity film 45A is higher than the acoustic velocity of the acoustic wave propagating through the piezoelectric layer 6A. The low acoustic velocity film 5A is provided on the high acoustic velocity film 45A. Here, the expression "provided on the high acoustic velocity film 45A" includes a case being directly provided on the high acoustic velocity film 45A, and a case being indirectly provided on the high acoustic velocity film 45A. In the low acoustic velocity film 5A, an acoustic velocity of a bulk wave propagating through the low acoustic velocity film 5A is lower than the acoustic velocity of the bulk wave propagating through the piezoelectric layer 6A. The piezoelectric layer 6A is provided on the low acoustic velocity film 5A. Here, the expression "provided on the low acoustic velocity film 5A" includes a case being directly provided on the low acoustic velocity film 5A, and a case being indirectly provided on the low acoustic velocity film 5A.

The high acoustic velocity member 4B of the second acoustic wave resonator 3Bf includes a high acoustic velocity film 45B and a support substrate 44B, instead of the high acoustic velocity support substrate 42B. The high acoustic velocity film 45B is provided on the support substrate 44B. Here, the expression "provided on the support substrate 44B" includes a case being directly provided on the support substrate 44B and a case being indirectly provided on the support substrate 44B. In the high acoustic velocity film 45B, an acoustic velocity of a bulk wave propagating through the high acoustic velocity film 45B is higher than the acoustic velocity of the acoustic wave propagating through the piezoelectric layer 6B. The low acoustic velocity film 5B is provided on the high acoustic velocity film 45B. Here, the expression "provided on the high acoustic velocity film 45B" includes a case being directly provided on the high acoustic velocity film 45B and a case being indirectly provided on the high acoustic velocity film 45B. In the low acoustic velocity film 5B, an acoustic velocity of a bulk wave propagating through the low acoustic velocity film 5B is lower than the acoustic velocity of the bulk wave propagating through the piezoelectric layer 6B. The piezoelectric layer 6B is provided on the low acoustic velocity film 5B. Here, the expression "provided on the low acoustic velocity film 5B" includes a case being directly provided on the low acoustic velocity film 5B and a case being indirectly provided on the low acoustic velocity film 5B.

The material of the support substrate 44A and 44B is preferably silicon, for example. The material of the support substrates 44A and 44B is not limited to silicon, and may be a piezoelectric material, for example, sapphire, lithium tantalate, lithium niobate, quartz or the like, various ceramics, for example, alumina, magnesia, silicon nitride, aluminum nitride, silicon carbide, zirconia, cordierite, mullite, steatite, forsterite or the like, a dielectric, for example, glass, a semiconductor, for example, gallium nitride, resin, or the like.

In the first acoustic wave resonator 3Af, the high acoustic velocity film 45A significantly reduces or prevents leaking of energy of a main mode acoustic wave to the structure below the high acoustic velocity film 45A. Similarly, in the second acoustic wave resonator 3Bf, the high acoustic velocity film 45B significantly reduces or prevents leaking of the energy of the main mode acoustic wave to the structure below the high acoustic velocity film 45B.

In the first acoustic wave resonator 3Af, when the thickness of the high acoustic velocity film 45A is sufficiently thick, the energy of the main mode acoustic wave is distributed to the entire piezoelectric layer 6A and low acoustic velocity film 5A, is also distributed to a portion of the low acoustic velocity film 5A side of the high acoustic velocity film 45A, and is not distributed to the support substrate 44A. Similarly, in the second acoustic wave resonator 3Bf, when the thickness of the high acoustic velocity film 45B is sufficiently thick, the energy of the main mode acoustic wave is distributed to the entire piezoelectric layer 6B and low acoustic velocity film 5B, is also distributed to a portion of the low acoustic velocity film 5B side of the high acoustic velocity film 45B, and is not distributed to the support substrate 44B. The acoustic wave is confined by the high acoustic velocity films 45A and 45B similar to a case of a surface wave as a Love wave which is a non-leaking SH wave, and is described in the literature "Introduction to simulation technologies for surface acoustic wave devices", Hashimoto Kenya, Realize, p. 26 to 28, for example. Confining a surface acoustic wave as described above is different from confining the acoustic wave by a Bragg reflector with the acoustic multilayer film.

The material of the high acoustic velocity films 45A and 45B is preferably, for example, at least one selected from the group consisting of diamond-like carbon, aluminum nitride, aluminum oxide, silicon carbide, silicon nitride, silicon, sapphire, lithium tantalate, lithium niobate, quartz, alumina, zirconia, cordierite, mullite, steatite, forsterite, magnesia and diamond.

In the acoustic wave device according to Modification 3, the high acoustic velocity layers 4A and 4B include the high acoustic velocity films 45A and 45B. Accordingly, leakage of the acoustic wave to the support substrates 44A and 44B is able to be significantly reduced or prevented.

Further, as another modification of Preferred Embodiment 1, the multiplexer 100 is not limited to a quadplexer in which four filters are combined. The multiplexer 100 may be a multiplexer combining three or less filters, or a multiplexer combining five or more filters.

In the multiplexer 100, the acoustic wave device 1 and 1c according to Preferred Embodiment 1 or Modifications 2 and 3 may be applied not only to the first filter 11 but also to the second to fourth filters 12, 21, and 22.

Even in the acoustic wave device 1c and the multiplexer 100 and 100b according to each of the modifications, the same or similar advantageous effects as those of the acoustic wave device 1 and the multiplexer 100 according to Preferred Embodiment 1 are provided.

Preferred Embodiment 2

Figure 11A:
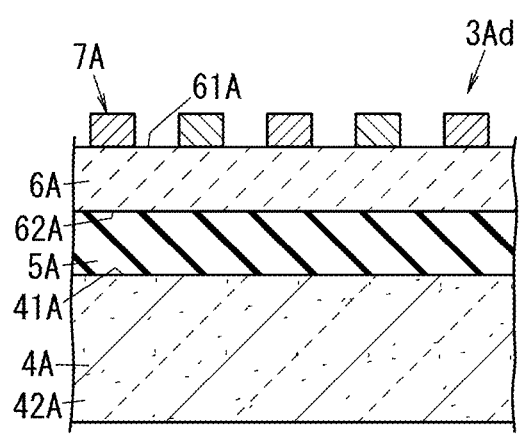
FIG. 11A is a sectional view of a first acoustic wave resonator in an acoustic wave device according to a Preferred Embodiment 2 of the present invention.
Figure 11B:
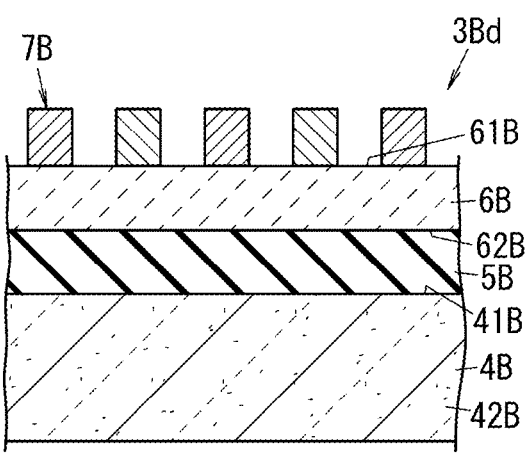
FIG. 11B is a sectional view of a second acoustic wave resonator in the acoustic wave device according to Preferred Embodiment 2 of the present invention.

An acoustic wave device according to Preferred Embodiment 2 of the present invention differs from the acoustic wave device 1 according to Preferred Embodiment 1 in that the acoustic wave device according to Preferred Embodiment 2 includes a first acoustic wave resonator 3Ad shown in FIG. 11A and a second acoustic wave resonator 3Bd shown in FIG. 11B, instead of the first acoustic wave resonator 3A and the second acoustic wave resonator 3B of the acoustic wave device 1 according to Preferred Embodiment 1. As the circuitry of the acoustic wave device according to Preferred Embodiment 2 is the same as or similar to the circuitry of the acoustic wave device 1 according to Preferred Embodiment 1, the depiction and description thereof will be omitted. In the acoustic wave device according to Preferred Embodiment 2, the same or similar elements as those of the acoustic wave device 1 according to Preferred Embodiment 1 are denoted by the same reference numerals, and the description thereof will be omitted.

In the acoustic wave device according to Preferred Embodiment 2, the thickness of the IDT electrode 7A of the first acoustic wave resonator 3Ad and the thickness of the IDT electrode 7B of the second acoustic wave resonator 3Bd are different from each other. The structure of the first acoustic wave resonator 3Ad is the same as or similar to that of the first acoustic wave resonator 3A of the acoustic wave device 1 according to Preferred Embodiment 1. The thicknesses of the IDT electrode 7A, the piezoelectric layer 6A, and the low acoustic velocity film 5A of the first acoustic wave resonator 3Ad are different from those of the first acoustic wave resonator 3A. The structure of the second acoustic wave resonator 3Bd is similar to that of the second acoustic wave resonator 3B of the acoustic wave device 1 according to Preferred Embodiment 1. The thicknesses of the IDT electrode 7B, the piezoelectric layer 6B, and the low acoustic velocity film 5B of the second acoustic wave resonator 3Bd are different from those of the second acoustic wave resonator 3B. In the acoustic wave device according to Preferred Embodiment 2, a mass per unit length in an electrode finger longitudinal direction (third direction D3 in FIG. 4A) of the electrode fingers of the IDT electrode 7A (first electrode finger 73A and second electrode finger 74A in FIG. 4A) is smaller than a mass per unit length in an electrode finger longitudinal direction (third direction D3 in FIG. 5A) of the electrode fingers of the IDT electrode 7B (first electrode finger 73B and second electrode finger 74B in FIG. 5A). The expression "unit length in the electrode finger length direction of the electrode finger" is, for example, the lengths of the first electrode fingers 73A and 73B and the second electrode fingers 74A and 74B in the third direction D3 (overlap widths LA and LB) in a region where the first electrode fingers 73A and 73B overlap with the second electrode fingers 74A and 74B (region where acoustic wave is excited) when viewed from the second direction D2 in FIG. 4A and FIG. 5A.

Figure 12:
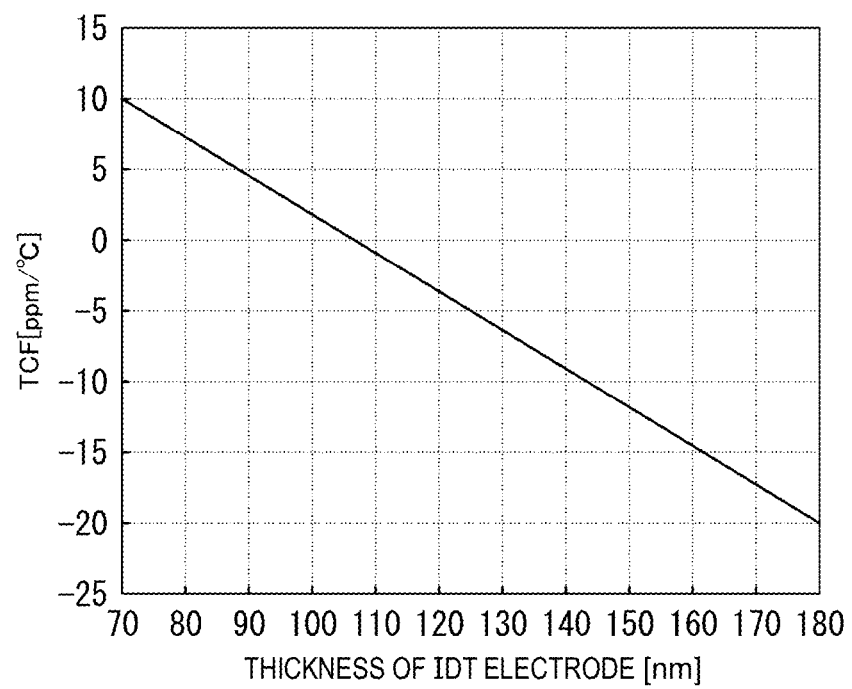
FIG. 12 is a graph describing a relationship between the thickness of an IDT electrode and the TCF with respect to the acoustic wave resonator in the acoustic wave device according to Preferred Embodiment 2 of the present invention.

FIG. 12 is a graph describing a relationship between the thickness of the IDT electrode (IDT electrodes 7A and 7B) and a TCF in the acoustic wave resonator (first acoustic wave resonator 3Ad and second acoustic wave resonator 3Bd). In the acoustic wave resonator, for example, the wavelength λ is set to about 2 μm, the thickness of the low acoustic velocity film made of silicon oxide (low acoustic velocity films 5A and 5B) is set to about 0.35λ, the thickness of the piezoelectric layers made of the 50° Y cut-X propagation $LiTaO_3$ piezoelectric single crystal (piezoelectric layers 6A and 6B) is set to about 0.3λ, and the thickness of the IDT electrode (IDT electrodes 7A and 7B) is changed in a range from about 70 nm to about 180 nm.

From FIG. 12, in the acoustic wave resonator, to provide the TCF absolute value of about 10 ppm or less, for example, the thickness of the IDT electrode may be set in a range of about 70 nm or more and about 140 nm or less. To provide the TCF absolute value of about 5 ppm or less, the thickness of the IDT electrode may be set in a range of about 90 nm or more to about 125 nm or less. In addition, in the acoustic wave resonator, when the thickness of the IDT electrode is reduced, the resistance value of the IDT electrode increases and the loss increases. Therefore, from the viewpoint of reducing the loss, it the thickness of the IDT electrode is preferably thicker. Thus, in the acoustic wave device according to Preferred Embodiment 2, from a viewpoint of temperature stability of a high-order mode and the viewpoint of are able to be significantly reducing or preventing an increase in a loss in a filter, as shown in FIGS. 11A and 11B, the mass per unit length in the electrode finger longitudinal direction of the electrode finger of the IDT electrode 7A of the first acoustic wave resonator 3Ad is preferably smaller than the mass per unit length in the electrode finger longitudinal direction of the electrode finger of the IDT electrode 7B of the second acoustic wave resonator 3Bd, for example.

Preferred Embodiment 3

Figure 13A:
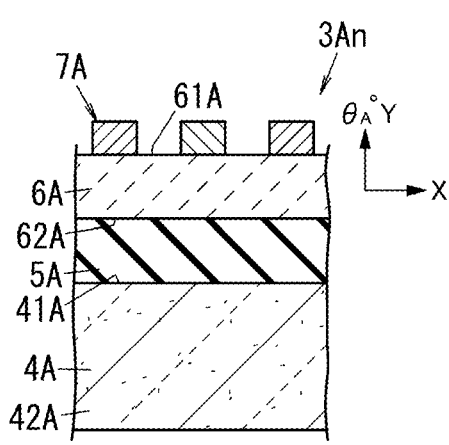
FIG. 13A is a sectional view of a first acoustic wave resonator in an acoustic wave device according to Preferred Embodiment 3 of the present invention.
Figure 13B:
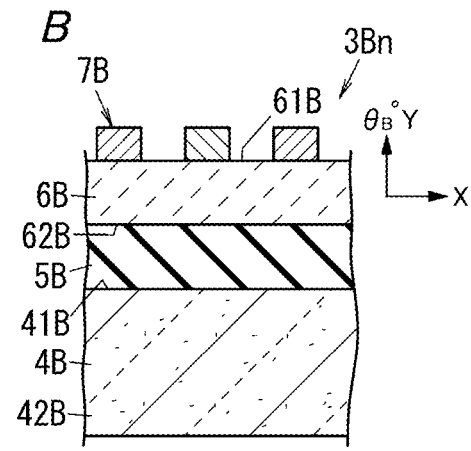
FIG. 13B is a sectional view of a second acoustic wave resonator in the acoustic wave device according to a Preferred Embodiment 3 of the present invention.

An acoustic wave device according to Preferred Embodiment 3 of the present invention differs from the acoustic wave device 1 according to Preferred Embodiment 1 in that the acoustic wave device according to Preferred Embodiment 3 includes a first acoustic wave resonator 3An shown in FIG. 13A and a second acoustic wave resonator 3Bn shown in FIG. 13B, instead of the first acoustic wave resonator 3A and the second acoustic wave resonator 3B in the acoustic wave device 1 according to Preferred Embodiment 1. As the circuitry of the acoustic wave device according to Preferred Embodiment 3 is the same as or similar to the circuitry of the acoustic wave device 1 according to Preferred Embodiment 1, the depiction and description thereof will be omitted. In the acoustic wave device according to Preferred Embodiment 3, the same or similar elements as those of the acoustic wave device 1 according to Preferred Embodiment 1 are denoted by the same reference numerals, and the description thereof will be omitted.

In the acoustic wave device according to Preferred Embodiment 3, a cut-angle $\theta_A$ of the piezoelectric layer 6A of the first acoustic wave resonator 3An is larger than the cut-angle $\theta_B$ of the piezoelectric layer 6B of the second acoustic wave resonator 3Bn.

Figure 14:
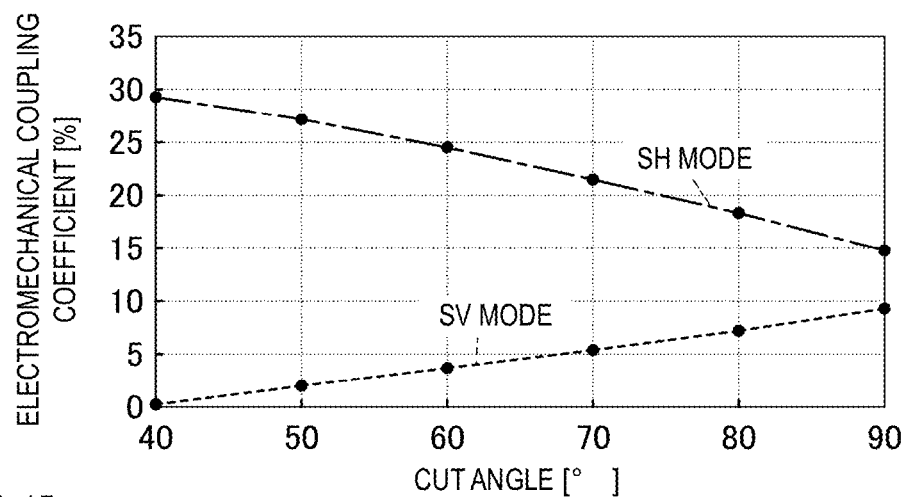
FIG. 14 is a graph describing a relationship between a cut-angle of a piezoelectric layer and an electromechanical coupling coefficient with respect to the acoustic wave resonator in the acoustic wave device according to Preferred Embodiment 3 of the present invention.
Figure 15:
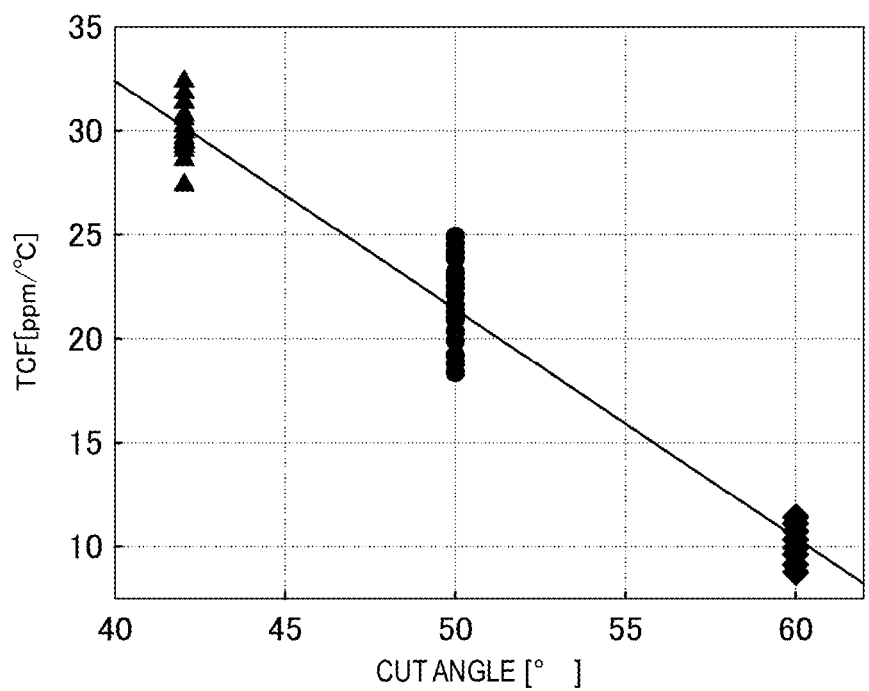
FIG. 15 is a graph describing a relationship between the cut-angle of the piezoelectric layer and the TCF with respect to the acoustic wave resonator in the acoustic wave device according to Preferred Embodiment 3 of the present invention.
Figure 16:
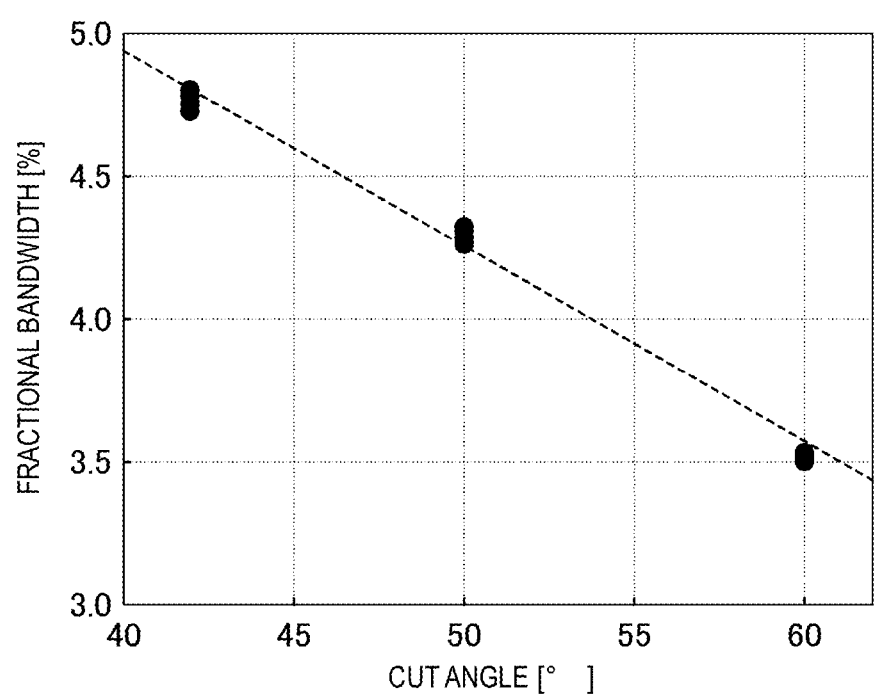
FIG. 16 is a graph describing a relationship between the cut-angle and a fractional bandwidth of the piezoelectric layer with respect to the acoustic wave resonator in the acoustic wave device according to Preferred Embodiment 3 of the present invention.

In the first acoustic wave resonator 3An, the surface 41A of the high acoustic velocity member 4A made of a silicon substrate is denoted as (111) plane. The thicknesses of the low acoustic velocity film 5A, the piezoelectric layer 6A, and the IDT electrode 7A are standardized by λ, which is the wavelength of the acoustic wave determined by the electrode finger period of the IDT electrode 7A. In the first acoustic wave resonator 3An, the wavelength λ is about 1.48 m, for example. FIG. 14 describes a relationship between the cut-angle and an electromechanical coupling coefficient in the acoustic wave resonator (first acoustic wave resonator 3An and second acoustic wave resonator 3Bn), when the thickness of the IDT electrode (IDT electrodes 7A and 7B) including aluminum is about 0.07λ, the thickness of the piezoelectric layer (the piezoelectric layers 6A and 6B) including an Γ° Y cut-X propagation LiTaO₃ piezoelectric single crystal is about 0.3λ, the thickness of the low acoustic velocity film (the low acoustic velocity films 5A and 5B) including silicon oxide is about 0.35λ, and the cut-angle θ is changed in a range from about 40° to about 90°. In FIG. 14, the relationship between the cut-angle and the electromechanical coupling coefficient is described by an alternate long and short dash line when an SH wave is a main mode, and the relationship between the cut-angle and the electromechanical coupling coefficient is described by a broken line when an SV wave is a main mode. FIG. 15 describes a relationship between the cut-angle and the TCF in the acoustic wave resonator (first acoustic wave resonator 3An and second acoustic wave resonator 3Bn). FIG. 16 describes a relationship between the cut-angle and the fractional bandwidth in the acoustic wave resonator (first acoustic wave resonator 3An and second acoustic wave resonator 3Bn).

From FIG. 14, it is clarified that, in the acoustic wave resonator (first acoustic wave resonator 3An and second acoustic wave resonator 3Bn), the electromechanical coupling coefficient in which the SH wave is the main mode tends to be smaller as the cut-angle becomes larger, and the electromechanical coupling coefficient in which the SV wave is the main mode tends to be larger as the cut-angle becomes larger. From a viewpoint of increasing the electromechanical coupling coefficient of the acoustic wave resonator, the cut-angle is preferably smaller.

From FIG. 15, in the acoustic wave resonator, the TCF absolute value tends to be smaller as the cut-angle becomes larger. From a viewpoint of reducing the TCF of the acoustic wave resonator, the cut-angle is preferably larger.

Further from FIG. 16, it is clarified that, in the acoustic wave resonator, a fractional bandwidth tends to be narrower as the cut-angle becomes larger. From a viewpoint of widening the fractional bandwidth of the acoustic wave resonator, the cut-angle is preferably smaller.

In the acoustic wave device according to Preferred Embodiment 3, since the cut-angle $\theta_A$ of the piezoelectric layer 6A of the first acoustic wave resonator 3An is larger than the cut-angle $\theta_B$ of the piezoelectric layer 6B of the second acoustic wave resonator 3Bn, the TCF absolute value of the first acoustic wave resonator 3An may be smaller than the TCF absolute value of the second acoustic wave resonator 3Bn. Accordingly, in the acoustic wave device according to Preferred Embodiment 3, frequency fluctuation of the high-order mode accompanying the temperature change is able to be significantly reduced or prevented.

The preferred embodiments and modifications described above are only a portion of the various preferred embodiments and modifications of the present invention. Further, the preferred embodiments and modifications may be modified according to design and the like.

The following features are provided with preferred embodiments of the present invention and modifications described above.

The acoustic wave device (1; 1c) according to a preferred embodiment of the present invention is provided between a first terminal (101) that is an antenna terminal and a second terminal (102) that is different from the first terminal (101). The acoustic wave device (1; 1c) includes a plurality of acoustic wave resonators (31 to 39). The plurality of acoustic wave resonators (31 to 39) includes a plurality of series arm resonators (acoustic wave resonators 31, 33, 35, 37, and 39) and a plurality of parallel arm resonators (acoustic wave resonators 32, 34, 36, and 38). The plurality of series arm resonators is provided on a first path (r1) that electrically connects the first terminal (101) and the second terminal (102). The plurality of parallel arm resonators is provided on a plurality of second paths (r21 to r24) electrically connecting each of the plurality of nodes (N1 to N4) on the first path (r1) and the ground. An acoustic wave resonator which is electrically closest to the first terminal (101) among the plurality of acoustic wave resonators (31 to 39) is an antenna end resonator, and the antenna end resonator is a first acoustic wave resonator (3A; 3Af; 3Ad; 3An). At least one acoustic wave resonator other than the antenna end resonator among the plurality of acoustic wave resonators (31 to 39) is a second acoustic wave resonator (3B; 3Bf; 3Bd; 3Bn). Each of the first acoustic wave resonator (3A; 3Af; 3Ad; 3An) and the second acoustic wave resonator (3B) includes a piezoelectric layer (6A; 6B), an IDT electrode (7A; 7B), and a high acoustic velocity member (4A; 4B). The IDT electrode (7A; 7B) is provided on the piezoelectric layer (6A; 6B) and includes a plurality of electrode fingers (first electrode finger 73A and second electrode finger 74A; first electrode finger 73B and second electrode finger 74B). The high acoustic velocity member (4A; 4B) is located on the side opposite to the IDT electrode (7A; 7B) with the piezoelectric layer (6A; 6B) interposed therebetween. In the high acoustic velocity member (4A; 4B), an acoustic velocity of a bulk wave propagating through the high acoustic velocity member (4A; 4B) is higher than an acoustic velocity of an acoustic wave propagating through the piezoelectric layer (6A; 6B). The thickness of the piezoelectric layer (6A; 6B) is about 3.5λ or less when the wavelength of the acoustic wave determined by the electrode finger period is denoted as λ, where the electrode finger period is the period of the plurality of electrode fingers (first electrode finger 73A and second electrode finger 74A; first electrode finger 73B and second electrode finger 74B) of the IDT electrode (7A; 7B). The first acoustic wave resonator (3A; 3Af; 3Ad; 3An) and the second acoustic wave resonator (3B; 3Bf; 3Bd; 3Bn) satisfy at least one of a first condition, a second condition, and a third condition. The first condition is that the first acoustic wave resonator (3A; 3Af; 3Ad; 3An) further includes a dielectric film (8A) provided between the piezoelectric layer (6A) and the IDT electrode (7A), and the second acoustic wave resonator (3B; 3Bf; 3Bd; 3Bn) does not include the dielectric film. The second condition is that a mass per unit length in an electrode finger longitudinal direction of the electrode fingers (first electrode finger 73A and second electrode finger 74A) of the IDT electrode (7A) of the first acoustic wave resonator (3A; 3Af; 3Ad; 3An) is smaller than the mass per unit length in the electrode finger longitudinal direction of the electrode fingers (first electrode finger 73B and second electrode finger 74B) of the IDT electrode (7B) of the second acoustic wave resonator (3B; 3Bf; 3Bd; 3Bn). The third condition is that a cut-angle of the piezoelectric layer (6A) of the first acoustic wave resonator (3A; 3Af; 3Ad; 3An) is larger than the cut-angle of the piezoelectric layer (6B) of the second acoustic wave resonator (3B; 3Bf; 3Bd; 3Bn).

With the above-described acoustic wave device (1; 1c), even when a high-order mode is present, a degree of change due to temperature in a frequency at which the high-order mode is generated is able to be significantly reduced. That is, the change of the high-order mode due to temperature is able to be significantly reduced or prevented.

In an acoustic wave device (1; 1c) according to a preferred embodiment of the present invention, the antenna end resonator is provided on a chip different from a chip on which the acoustic wave resonators other than the antenna end resonator in the plurality of acoustic wave resonators (31 to 39) are provided.

In the above-described acoustic wave device (1; 1c), a variation in the characteristics of the acoustic wave resonator other than the antenna end resonator is able to be significantly reduced or prevented.

In an acoustic wave device (1; 1c) according to a preferred embodiment of the present invention, the first acoustic wave resonator (3A; 3Af; 3Ad; 3An) or the second acoustic wave resonator (3B; 3Bf; 3Bd; 3Bn) includes a low acoustic velocity film (5A; 5B). The low acoustic velocity film (5A; 5B) is provided between the high acoustic velocity member (4A; 4B) and the piezoelectric layer (6A; 6B). In the low acoustic velocity film (5A; 5B), an acoustic velocity of a bulk wave propagating through the low acoustic velocity film (5A; 5B) is lower than an acoustic velocity of a bulk wave propagating through the piezoelectric layer (6A; 6B).

In the above-described acoustic wave device (1; 1c), both of expansion of a fractional bandwidth and the significant improvement of frequency-temperature characteristics are able to be provided because of an increase in an electromechanical coupling coefficient.

In an acoustic wave device (1; 1c) according to a preferred embodiment of the present invention, the material of the piezoelectric layer (6A; 6B) is lithium tantalate or lithium niobate. The material of the low acoustic velocity film (5A; 5B) is silicon oxide. The material of the high acoustic velocity member (4A; 4B) is silicon.

In the above-described acoustic wave device (1; 1c), a loss is able to be significantly reduced or prevented and a Q factor is able to be significantly increased in comparison with a case where the low acoustic velocity films (5A; 5B) are not provided.

In an acoustic wave device (1; 1c) according to a preferred embodiment of the present invention, the high acoustic velocity member (4A; 4B) includes the high acoustic velocity films (45A; 45B) and support substrates (44A; 44B). The high acoustic velocity film (45A; 45B) is a film in which an acoustic velocity of a bulk wave propagating through the high acoustic velocity film (45A; 45B) is higher than the acoustic velocity of the acoustic wave propagating through the piezoelectric layer (6A; 6B). The support substrate (44A; 44B) supports the high acoustic velocity film (45A; 45B). Each of the first acoustic wave resonator (3Af) and the second acoustic wave resonator (3Bf) includes the low acoustic velocity film (5A; 5B). The low acoustic velocity film (5A; 5B) is a film in which an acoustic velocity of a bulk wave propagating through the low acoustic velocity film (5A; 5B) is lower than the acoustic velocity of the acoustic wave propagating through the piezoelectric layer (6A; 6B) provided on the high acoustic velocity film (45A; 45B).

In the above-described acoustic wave device (1; 1c), leakage of the acoustic wave to the support substrate (44A; 44B) is able to be significantly reduced or prevented.

In an acoustic wave device (1; 1c) according to a preferred embodiment of the present invention, the material of the piezoelectric layer (6A; 6B) is lithium tantalate or lithium niobate. The material of the low acoustic velocity film (5A; 5B) is at least one selected from a group consisting of silicon oxide, glass, silicon oxynitride, tantalum oxide, and a compound in which fluorine, carbon, or boron is added to silicon oxide. The material of the high acoustic velocity film (45A; 45B) is at least one selected from a group consisting of diamond-like carbon, aluminum nitride, aluminum oxide, silicon carbide, silicon nitride, silicon, sapphire, lithium tantalate, lithium niobate, quartz, alumina, zirconia, cordierite, mullite, steatite, forsterite, magnesia, or diamond.

In an acoustic wave device (1; 1c) according to a preferred embodiment of the present invention, each of the first acoustic wave resonator (3A; 3Ad; 3An) and the second acoustic wave resonator (3B; 3Bd; 3Bn) further includes the low acoustic velocity film (5A; 5B). The low acoustic velocity film (5A; 5B) is provided between the high acoustic velocity member (4A; 4B) and the piezoelectric layer (6A; 6B), and is a film in which the acoustic velocity of the bulk wave propagating through the low acoustic velocity film (5A; 5B) is lower than the acoustic velocity of the bulk wave propagating through the piezoelectric layer (6A; 6B). The high acoustic velocity member (4A; 4B) is a high acoustic velocity support substrate (42A; 42B) in which an acoustic velocity of a bulk wave propagating through the high acoustic velocity member (4A; 4B) is higher than the acoustic velocity of the acoustic wave propagating through the piezoelectric layer (6A; 6B)

In the above-described acoustic wave device (1; 1c), the loss is able to be significantly reduced or prevented and the Q factor is able to be significantly increased in comparison with a case where each of the first acoustic wave resonator (3A; 3Ad; 3An) and the second acoustic wave resonator (3B; 3Bd; 3Bn) does not include the low acoustic velocity film (5A; 5B).

In an acoustic wave device (1; 1c) according to a preferred embodiment of the present invention, one series arm resonator (acoustic wave resonators 31) among the plurality of series arm resonators (acoustic wave resonators 31, 33, 35, 37, and 39) is electrically closer to the first terminal (101) than the plurality of parallel arm resonators (acoustic wave resonators 32, 34, 36, and 38). The one series arm resonator (acoustic wave resonator 31) is the antenna end resonator.

In an acoustic wave device (1c) according to a preferred embodiment of the present invention, one series arm resonator (acoustic wave resonator 31) among the plurality of series arm resonators (acoustic wave resonators 31, 33, 35, and 37) and one parallel arm resonator (acoustic wave resonator 32) among the plurality of parallel arm resonators (acoustic wave resonators 32, 34, 36, and 38) are directly connected to the first terminal (101). At least either one of the one series arm resonator (acoustic wave resonator 31) or the one parallel arm resonator (acoustic wave resonator 32) is the antenna end resonator.

A multiplexer (100; 100b) according to a preferred embodiment of the present invention includes the first filter (11) and the second filter (12) defined by the acoustic wave device (1; 1c) according to any one of the first to ninth aspects. The second filter (12) is provided between the first terminal (101) and a third terminal (103) that is different from the first terminal (101). The pass band of the first filter (11) is in a higher frequency band than the pass band of the second filter (12).

In the multiplexer (100; 100b) according to the tenth aspect, even when the high-order mode is present in the acoustic wave device (1; 1c), the degree of change due to temperature in the frequency at which the high-order mode is generated is able to be significantly. That is, the change of the high-order mode due to temperature is able to be significantly reduced or prevented.

In a multiplexer (100b) according to a preferred embodiment of the present invention, a plurality of resonator groups (30) each including the plurality of acoustic wave resonators (31 to 39) are provided. In the plurality of resonator groups (30), the first terminal (101) is a common terminal, and the second terminal (102) is an individual terminal. The antenna end resonators in the plurality of resonator groups (30) are integrated in one chip.

In the above-described multiplexer (100b), the variation in the characteristics of the antenna end resonators in the plurality of resonator groups (30) is able to be significantly reduced or prevented, and a size of the acoustic wave device (1; 1c) is able to be significantly reduced.

In a multiplexer (100; 100b) according to a preferred embodiment of the present invention, the lowest frequency of the pass band of the first filter (11) is higher than the highest frequency of the pass band of the second filter (12).

A high-frequency front end circuit (300) according to a preferred embodiment of the present invention includes a multiplexer (100; 100b) according to a preferred embodiment of the present invention and a (first) amplifier circuit (303). The (first) amplifier circuit (303) is electrically connected to the multiplexer (100).

In the above-described high-frequency front end circuit (300), even when the high-order mode is present in the acoustic wave device (1; 1c), the degree of change due to temperature in the frequency at which the high-order mode is generated is able to be significantly reduced. That is, the change of the high-order mode due to temperature is able to be significantly reduced or prevented.

A communication device (400) according to a according to the thirteenth aspect includes a high-frequency front end circuit (300) according to a preferred embodiment of the present invention and signal processing circuits (RF signal processing circuit 401 and baseband signal processing circuit 402). The signal processing circuit processes the high frequency signal received at an antenna (200). The high-frequency front end circuit (300) transmits a high frequency signal between the antenna (200) and the signal processing circuit.

In the above-described communication device (400), even when the high-order mode is present in the acoustic wave device (1; 1c), the degree of change due to temperature in the frequency at which the high-order mode is generated is able to be significantly reduced. That is, the change of the high-order mode due to temperature is able to be significantly reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device provided between a first terminal which is an antenna terminal and a second terminal which is different from the first terminal, the acoustic wave device comprising:
    a plurality of acoustic wave resonators; wherein
    the plurality of acoustic wave resonators include:
        a plurality of series arm resonators provided on a first path electrically connecting the first terminal and the second terminal; and
        a plurality of parallel arm resonators provided on a plurality of second paths electrically connecting each of a plurality of nodes on the first path and ground;
    an acoustic wave resonator electrically closest to the first terminal among the plurality of acoustic wave resonators is an antenna end resonator, and the antenna end resonator is a first acoustic wave resonator;
    at least one acoustic wave resonator other than the antenna end resonator among the plurality of acoustic wave resonators is a second acoustic wave resonator;
    each of the first acoustic wave resonator and the second acoustic wave resonator includes:
        a piezoelectric layer;
        an interdigital transducer (IDT) electrode provided on the piezoelectric layer and including a plurality of electrode fingers; and
        a high acoustic velocity member which is located on a side opposite to the IDT electrode with the piezoelectric layer interposed between the high acoustic velocity layer and the IDT electrode and in which an acoustic velocity of a bulk wave propagating through is higher than an acoustic velocity of an acoustic wave propagating through the piezoelectric layer;
    a thickness of the piezoelectric layer is about 3.5λ or less when a wavelength of an acoustic wave determined by an electrode finger period, which is a period of the plurality of electrode fingers of the IDT electrode, is denoted as λ;
    the first acoustic wave resonator and the second acoustic wave resonator satisfy at least one of a first condition, a second condition, and a third condition;
    the first condition is a condition that the first acoustic wave resonator further includes a dielectric film provided between the piezoelectric layer and the IDT electrode, and the second acoustic wave resonator does not include the dielectric film or further includes a dielectric film that has a thickness smaller than a thickness of the dielectric film of the first acoustic wave resonator;
    the second condition is a condition that a mass per unit length in an electrode finger longitudinal direction of electrode fingers of the IDT electrode of the first acoustic wave resonator is smaller than a mass per unit length in the electrode finger longitudinal direction of electrode fingers of the IDT electrode of the second acoustic wave resonator; and
    the third condition is a condition that a cut-angle of the piezoelectric layer of the first acoustic wave resonator is larger than a cut-angle of the piezoelectric layer of the second acoustic wave resonator.

2. The acoustic wave device according to claim 1, wherein
    at least one acoustic wave resonator including the antenna end resonator among the plurality of acoustic wave resonators is the first acoustic wave resonator;
    the acoustic wave resonator other than the at least one acoustic wave resonator among the plurality of acoustic wave resonators is the second acoustic wave resonator; and
    the first acoustic wave resonator is provided on a chip different from a chip on which the second acoustic wave resonator is provided.

3. The acoustic wave device according to claim 1, wherein the first acoustic wave resonator or the second acoustic wave resonator includes a low acoustic velocity film which is provided between the high acoustic velocity member and the piezoelectric layer and in which an acoustic velocity of a bulk wave propagating through is lower than an acoustic velocity of a bulk wave propagating through the piezoelectric layer.

4. The acoustic wave device according to claim 3, wherein
a material of the piezoelectric layer is lithium tantalate or lithium niobate;
a material of the low acoustic velocity film is silicon oxide; and
a material of the high acoustic velocity member is silicon.

5. The acoustic wave device according to claim 1, wherein the high acoustic velocity member includes:
   a high acoustic velocity film in which an acoustic velocity of a bulk wave propagating through is higher than the acoustic velocity of the acoustic wave propagating through the piezoelectric layer; and
   a support substrate that supports the high acoustic velocity film; and
each of the first acoustic wave resonator and the second acoustic wave resonator includes a low acoustic velocity film which is provided on the high acoustic velocity film and in which an acoustic velocity of a bulk wave propagating through is lower than an acoustic velocity of a bulk wave propagating through the piezoelectric layer.

6. The acoustic wave device according to claim 5, wherein
a material of the piezoelectric layer is lithium tantalate or lithium niobate;
a material of the low acoustic velocity film is at least one selected from a group consisting of silicon oxide, glass, silicon oxynitride, tantalum oxide, and a compound provided by adding fluorine, carbon, or boron to silicon oxide; and
a material of the high acoustic velocity film is at least one selected from a group consisting of diamond-like carbon, aluminum nitride, aluminum oxide, silicon carbide, silicon nitride, silicon, sapphire, lithium tantalate, lithium niobate, quartz, alumina, zirconia, cordierite, mullite, steatite, forsterite, magnesia, and diamond.

7. The acoustic wave device according to claim 1, wherein
each of the first acoustic wave resonator and the second acoustic wave resonator further includes a low acoustic velocity film which is provided between the high acoustic velocity member and the piezoelectric layer and in which an acoustic velocity of a bulk wave propagating through is lower than an acoustic velocity of a bulk wave propagating through the piezoelectric layer; and
the high acoustic velocity member is a high acoustic velocity support substrate in which an acoustic velocity of a bulk wave propagating through is higher than the acoustic velocity of the acoustic wave propagating through the piezoelectric layer.

8. The acoustic wave device according to claim 1, wherein
one series arm resonator among the plurality of series arm resonators is electrically closer to the first terminal than the plurality of parallel arm resonators; and
the one series arm resonator is the antenna end resonator.

9. The acoustic wave device according to claim 1, wherein
one series arm resonator among the plurality of series arm resonators and one parallel arm resonator among the plurality of parallel arm resonators are directly connected to the first terminal; and
at least one of the one series arm resonator and the one parallel arm resonator is the antenna end resonator.

10. A multiplexer comprising:
a first filter defined by the acoustic wave device according to claim 1; and
a second filter provided between the first terminal and a third terminal that is different from the first terminal; wherein
a pass band of the first filter is a lower frequency band than a pass band of the second filter.

11. The multiplexer according to claim 10, wherein
the multiplexer includes a plurality of resonator groups each including the plurality of acoustic wave resonators;
the first terminal is a common terminal and the second terminal is an individual terminal in the plurality of resonator groups; and
the antenna end resonators of the plurality of resonator groups are integrated in one chip.

12. The multiplexer according to claim 10, wherein a lowest frequency of the pass band of the first filter is higher than a highest frequency of the pass band of the second filter.

13. A high-frequency front end circuit comprising:
the multiplexer according to claim 10; and
an amplifier circuit electrically connected to the multiplexer.

14. A communication device comprising:
the high-frequency front end circuit according to claim 13; and
a signal processing circuit that processes a high frequency signal received by an antenna; wherein
the high-frequency front end circuit transmits the high frequency signal between the antenna and the signal processing circuit.

15. The multiplexer according to claim 10, further comprising a third filter provided between the first terminal and a fourth terminal that is different from the first terminal.

16. The acoustic wave device according to claim 3, wherein a thickness of the low acoustic velocity film is about $2.0\lambda$ or less.

17. The acoustic wave device according to claim 1, wherein the piezoelectric layer is an $\Gamma°$ Y cut-X propagation $LiTaO_3$ piezoelectric single crystal.

18. The acoustic wave device according to claim 1, wherein the plurality of acoustic wave resonators is provided side by side in an acoustic wave propagation direction to define a longitudinally coupled filter structure.

* * * * *